(12) United States Patent
Kumar et al.

(10) Patent No.: US 7,978,496 B2
(45) Date of Patent: Jul. 12, 2011

(54) METHOD OF PROGRAMMING A NONVOLATILE MEMORY DEVICE CONTAINING A CARBON STORAGE MATERIAL

(75) Inventors: Tanmay Kumar, Pleasanton, CA (US); Xiying Chen, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 284 days.

(21) Appl. No.: 12/314,903

(22) Filed: Dec. 18, 2008

(65) Prior Publication Data
US 2010/0157651 A1  Jun. 24, 2010

(51) Int. Cl.
G11C 11/00 (2006.01)
(52) U.S. Cl. ......... 365/148; 365/163; 365/151; 365/157
(58) Field of Classification Search ............... 365/148, 365/158, 163, 171, 173, 151, 157
See application file for complete search history.

(56) References Cited

U.S. PATENT DOCUMENTS

| 3,404,061 | A | 10/1968 | Shane at al. |
| 5,915,167 | A | 6/1999 | Leedy |
| 6,055,180 | A | 4/2000 | Gudesen et al. |
| 6,706,402 | B2 | 3/2004 | Rueckes et al. |
| 7,081,377 | B2 | 7/2006 | Cleeves |
| 7,095,645 | B2 * | 8/2006 | Pinkerton et al. ............. 365/151 |
| 7,105,108 | B2 | 9/2006 | Kaschak et al. |
| 7,176,064 | B2 | 2/2007 | Herner |
| 7,307,268 | B2 * | 12/2007 | Scheuerlein ....................... 257/2 |
| 7,723,180 | B2 | 5/2010 | Chen et al. |
| 7,728,405 | B2 * | 6/2010 | Kreupl ......................... 257/528 |
| 7,745,312 | B2 | 6/2010 | Herner et al. |
| 7,781,862 | B2 * | 8/2010 | Bertin et al. .................. 257/529 |
| 7,830,698 | B2 | 11/2010 | Chen et al. |
| 7,859,887 | B2 | 12/2010 | Chen et al. |
| 7,906,392 | B2 | 3/2011 | Dunton et al. |
| 2005/0226067 | A1 | 10/2005 | Herner et al. |
| 2006/0250836 | A1 | 11/2006 | Herner et al. |
| 2006/0250837 | A1 | 11/2006 | Herner et al. |
| 2006/0250856 | A1 | 11/2006 | Bertin et al. |
| 2008/0070162 | A1 * | 3/2008 | Ufert ............................. 430/290 |
| 2008/0142850 | A1 * | 6/2008 | Bertin et al. .................. 257/213 |
| 2008/0217732 | A1 | 9/2008 | Kreupl |
| 2008/0237599 | A1 | 10/2008 | Herner et al. |
| 2009/0184389 | A1 | 7/2009 | Bertin et al. |
| 2009/0258135 | A1 | 10/2009 | Kumar et al. |
| 2010/0259960 | A1 * | 10/2010 | Samachisa ...................... 365/51 |

OTHER PUBLICATIONS

Kreupl et al. "Carbon-Based Resistive Memory" Electron Devices Meeting, 2008. IEDM 2008. IEEE International, Dec. 15-17, 2008.*

(Continued)

*Primary Examiner* — Tuan T Nguyen
*Assistant Examiner* — R Lance Reidlinger
(74) *Attorney, Agent, or Firm* — The Marbury Law Group, PLLC

(57) ABSTRACT

A nonvolatile memory cell includes a steering element located in series with a storage element, where the storage element comprises a carbon material. A method of programming the cell includes applying a reset pulse to change a resistivity state of the carbon material from a first state to a second state which is higher than the first state, and applying a set pulse to change a resistivity state of the carbon material from the second state to a third state which is lower than the second state. A fall time of the reset pulse is shorter than a fall time of the set pulse.

18 Claims, 20 Drawing Sheets

OTHER PUBLICATIONS

Franz Kreupl et al. "Carbon-based resistive memory", IEDM 2008. IEEE International Electron Devices Meeting. Technical Digest IEEE, Piscataway, NJ USA, International Electron Devices Meeting. IEDM Technical Digest, Dec. 15, 2008, pp. 1-4.

Invitation to Pay Additional Fees, including International Search Report mailed Mar. 24, 2010, received in International Application No. PCT/US2009/067602.

International Search Report and Written Opinion, International Application PCT/US2009/067602. ISA/EP (European Patent Office), Jun. 28, 2010.

A. M. Rao et al., In situ-grown carbon nanotube array with excellent field emission characteristics, Applied Physics Letters, (2000), pp. 3813-3815, vol. 76, No. 25.

Tomohiro Nozaki et al., Fabrication of vertically aligned single-walled carbon nanotubes in atmospheric pressure non-thermal plasma CVD, Carbon, (2007), pp. 364-374, vol. 45.

E. Salonen et al., Ion-irradiation-Induced defects in bundles of carbon nanotubes, Nuclear Instruments and Methods in Physics Research B, (2002), pp. 603-608, vol. 193.

Jun Li et al., Bottom-up approach for carbon nanotube Interconnects, Applied Physics Letters, (2003), pp. 2491-2493. vol. 82, No. 15.

Hua-Chiang Wen et al., Effects of ammonia plasma treatment on the surface characteristics of carbon fibers, Surface & Coatings Technology, (2006), pp. 3166-3169, vol. 200.

M Meyyappan et al., Carbon nanotube growth by PECVD: a review, Plasma Sources Sci. Technol., (2003). pp. 205-216, vol. 12.

Y. Abdi et al., PECVD-grown carbon nanotubes on silicon substrates with a nickel-seeded tip-growth structure, Materials Science and Engineering C, (2006), pp. 1219-1223, vol. 26.

J. B. Cui et al., Carbon nanotube memory devices of high charge storage stability, Applied Physics Letters, (2002), pp. 3260-3262, vol. 81, No. 17.

Young Min Shin et al., Influence of morphology of catalyst thin film on vertically aligned carbon nanotube growth, Journal of Crystal Growth, (2004), pp. 81-89, vol. 271.

P. Smith et al., Polishing TIN for Nanotube Synthesis, Proceedings of the 16th Annual Meeting of the American Society for Precision Engineering, (2001), Crystal City, VA.

Kevin Bullis, TR10: Graphene Transistors A new fomr of carbon being pioneered by Walter de Heer of Georgia Tech could lead to speedy, compact computer processors, Technology Review, (2008), vol. 20242.

William S. Hummers et al., Preparation of Graphitic Oxide, Journal of American Chemical Society, (1958), pp. 1339, vol. 80.

K.S. Novoselov et al., Electric field effect in atomically thin carbon films, Science, (2004), pp. 666-669, vol. 306.

Dan Li et al., Processabie aqueous dispersions of grapheme nanosheets, Nature Nanotechnology, (2008), pp. 101-105, vol. 3, Nature Publishing Group.

Nina Kovtyukhova et al., Layer-by-layer assembly of ultrathin composite films from micron-sized graphite oxide sheets and polycations, American Chemical Society (1999), pp. 771-778, vol. 11.

U.S. Appl. No. 09/560,626, filed Apr. 28, 2000, Knall.

* cited by examiner

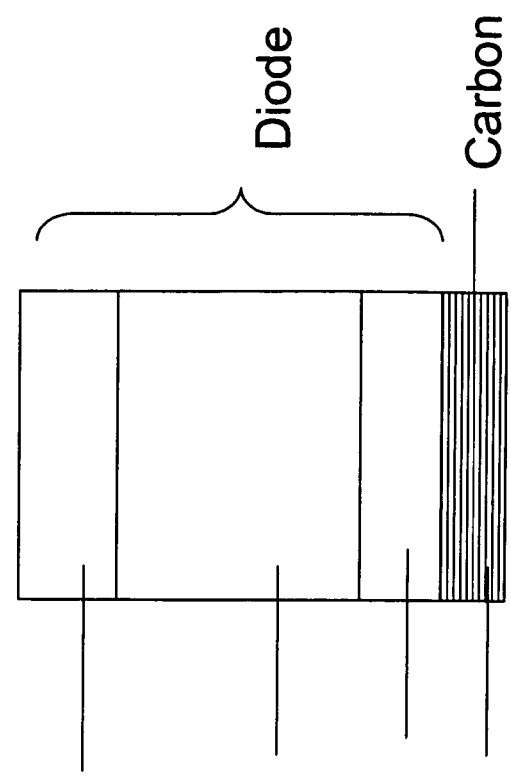
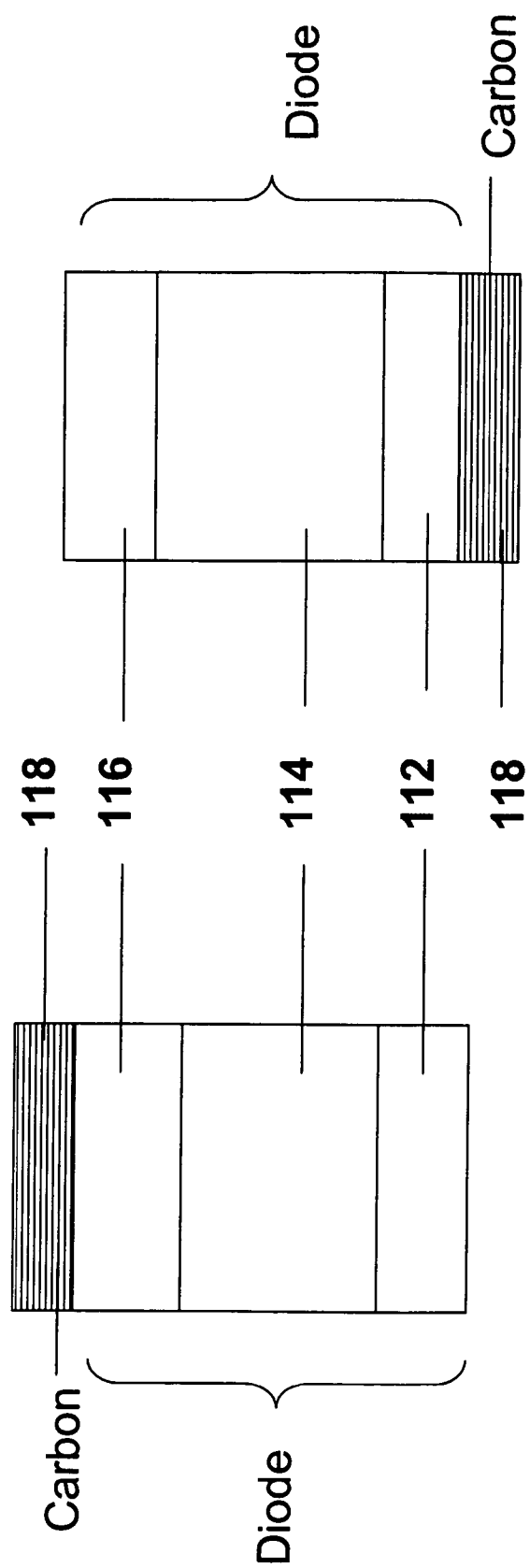

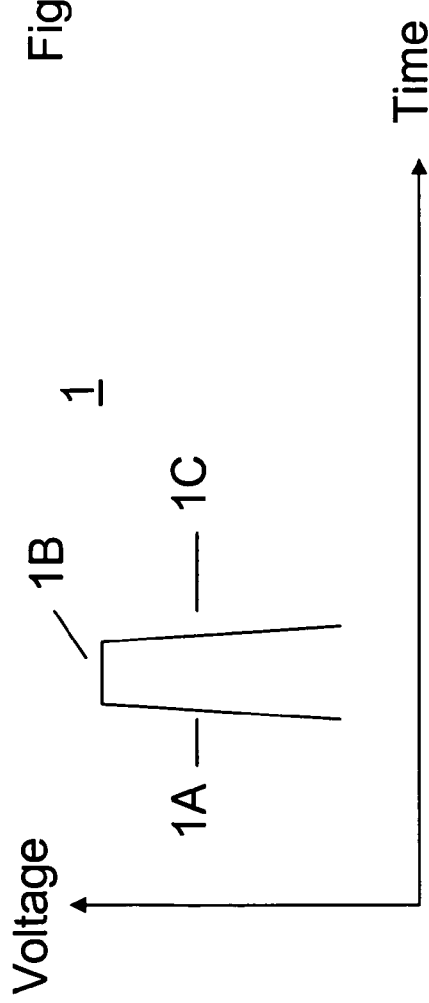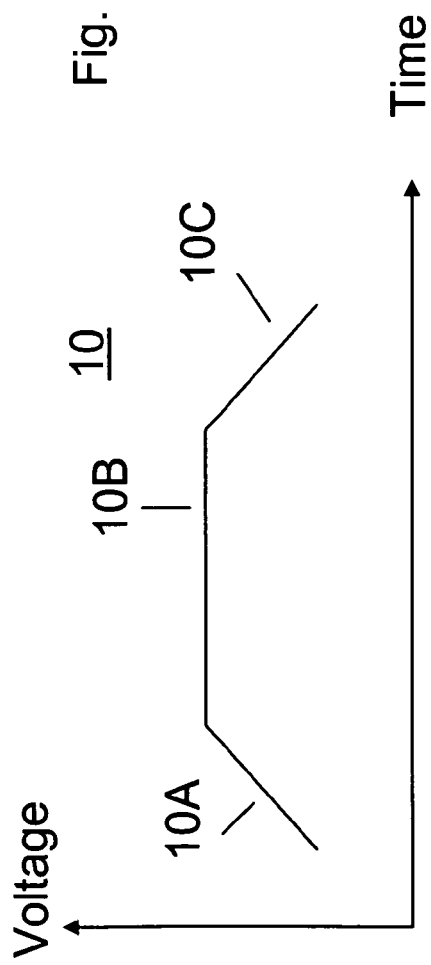

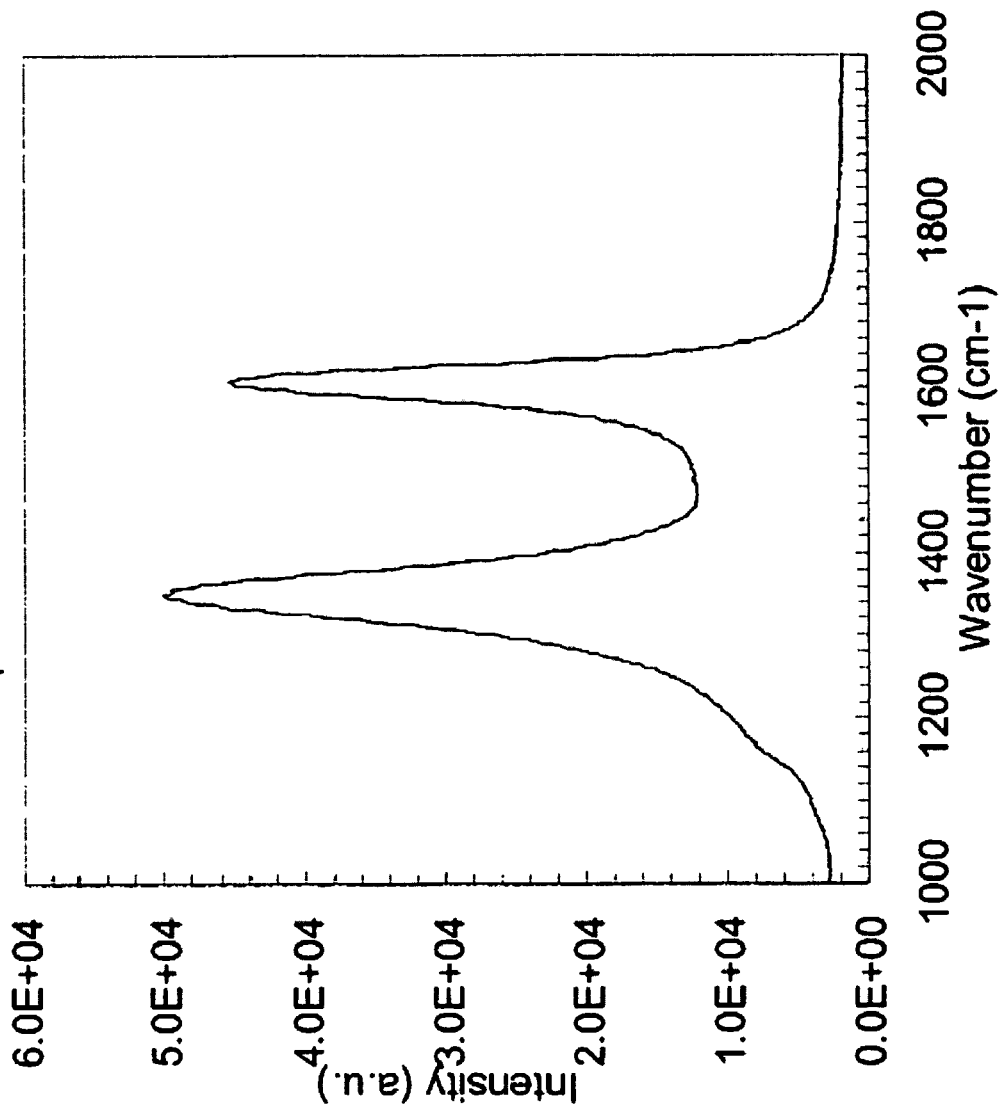

US 7,978,496 B2

METHOD OF PROGRAMMING A NONVOLATILE MEMORY DEVICE CONTAINING A CARBON STORAGE MATERIAL

BACKGROUND OF THE INVENTION

The invention relates to a method of programming nonvolatile memory array.

Nonvolatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

SUMMARY

A nonvolatile memory cell includes a steering element located in series with a storage element, where the storage element comprises a carbon material. A method of programming the cell includes applying a reset pulse to change a resistivity state of the carbon material from a first state to a second state which is higher than the first state, and applying a set pulse to change a resistivity state of the carbon material from the second state to a third state which is lower than the second state.

BRIEF DESCRIPTION OF THE DRAWINGS

FIGS. 3A-3B are side cross-sectional views illustrating two embodiments of a memory cell.

FIGS. 5, 6, 7A, 7B and 7C are plots of voltage amplitude versus time illustrating a shape of reset and set pulses of the embodiments of the invention. The pulse amplitudes and durations are not to scale.

FIG. 9 is a Raman spectrum of polycrystalline carbon of an embodiment of the invention.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
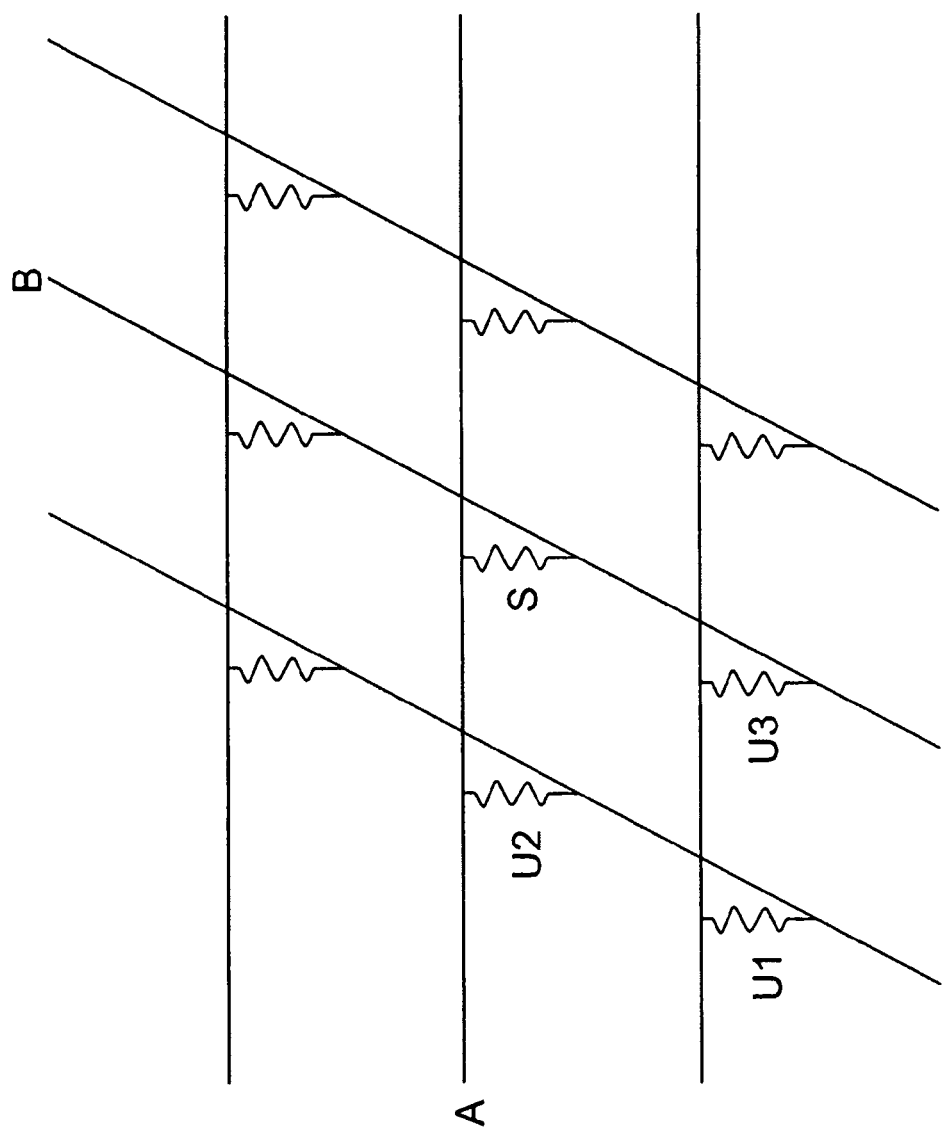
FIG. 1 is a circuit diagram illustrating the need for electrical isolation between memory cells in a memory array.

However, making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell with a steering element, such as a transistor or a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

In this discussion, transition from a higher- to a lower-resistivity state will be called a set transition, affected by a set current, a set or programming voltage, or a set or programming pulse; while the reverse transition, from a lower- to a higher-resistivity state, will be called a reset transition, affected by a reset current, a reset voltage, or a reset pulse which places the diode in an unprogrammed state.

Figure 2A:
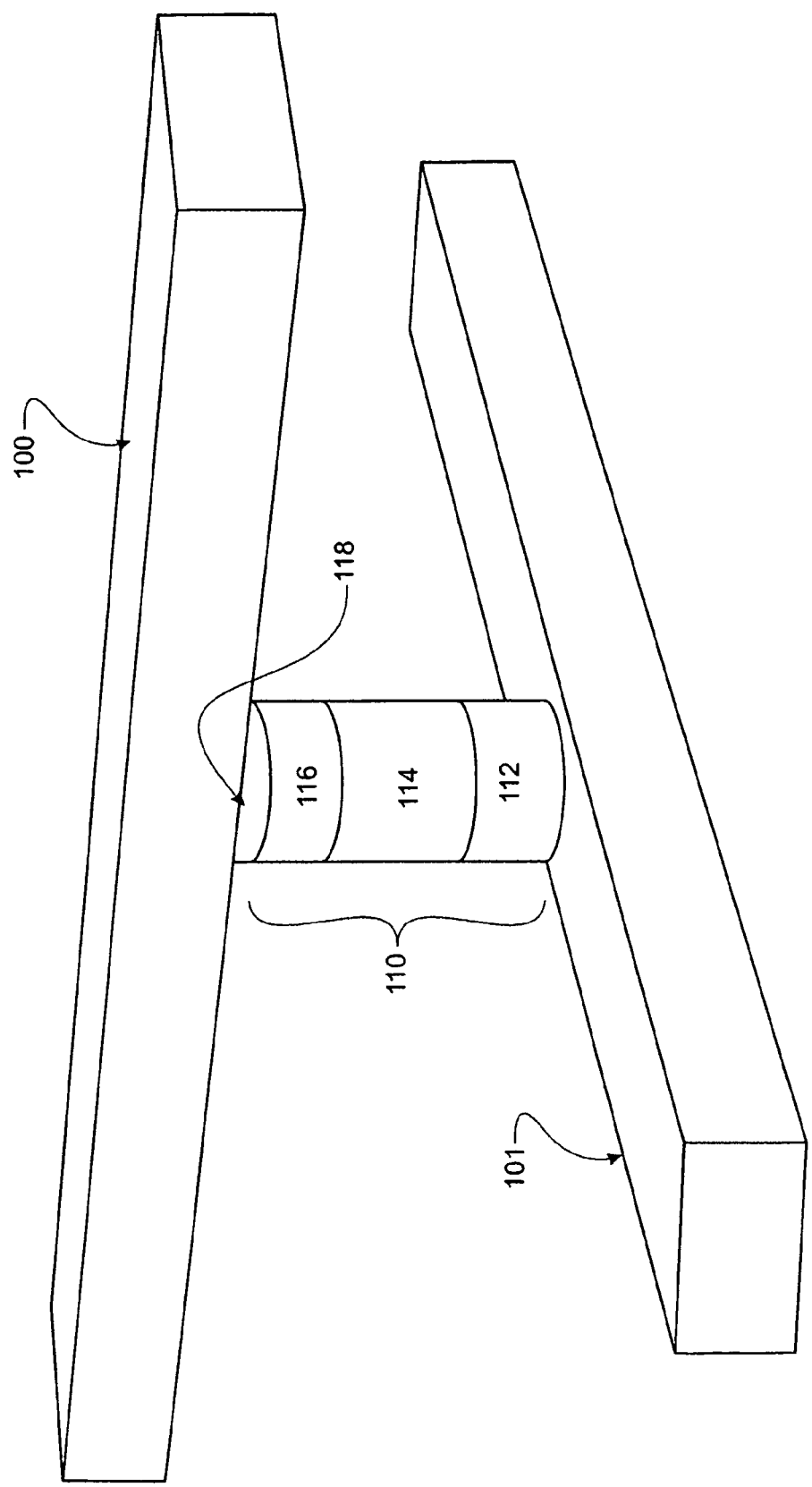
FIG. 2A is a perspective view of a memory cell formed according to an embodiment of the present invention.

In preferred embodiments, the memory cell includes a steering element, such as a transistor or a diode, and a storage element, such as a carbon resistivity switching material. Preferably, the steering element comprises a diode and the carbon resistivity switching material comprises polycrystalline carbon (which includes microcrystalline and nanocrystalline carbon), amorphous carbon, graphene or carbon nanotubes (single walled, multi-walled or a mixture of single and multi-walled nanotubes). Most preferably, the diode comprises a cylindrical semiconductor diode which is located in series with a cylindrical carbon resistivity switching material layer, film or region. The diode and the resistivity switching material are disposed between two electrodes, as illustrated in FIG. 2A. The diode and resistivity switching material may have a shape other than cylindrical, if desired. For a detailed description of a the design of a memory cell comprising a diode and a resistivity switching material, see for example U.S. patent application Ser. No. 11/125,939 filed on May 9, 2005 (which corresponds to U.S. Published Application No. 2006/0250836 to Herner et al.), and U.S. patent application Ser. No. 11/395,995 filed on Mar. 31, 2006 (which corresponds to U.S. Patent Published Application No. 2006/0250837 to Herner et al.,) each of which is hereby incorporated by reference.

FIG. 2A illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed, as shown in FIGS. 4a to 4d. Such a diode, regardless of its orientation, will be referred to as a p-i-n diode or simply diode. The storage element, such as the carbon resistivity switching material 118 is disposed above or below the diode. For example, material 118 may be disposed on the p-type region 116 or below the n-region 112 of the diode 110, as shown for example in FIGS. 3A and 3B. An optional intermediate conductive layer, such as a TiN layer, may be disposed between the diode 110 and the material 118. Top conductor 100 may be formed in the same manner and of the same materials as bottom conductor 101, and extends in a second direction different from the first direction. The semiconductor diode 110 is vertically disposed between bottom conductor 101 and top conductor 100 (i.e., electrodes 101 and 100). The diode can comprise any single crystal, polycrystalline, or amorphous semiconductor material, such as silicon, germanium, or silicon-germanium alloys. Thus, the memory cell shown in FIG. 2A comprises a vertical two terminal cell containing the two-terminal based diode steering element. However, a three-terminal cell containing a transistor steering element may also be used. The conductive path between the electrodes can be either a vertical one, a side-wall vertical one, a combination of vertical and lateral one, or a combination of vertical and lateral one with an adhesion layer, as will be described in more detail below.

In the preferred embodiments, the diode 110 comprises three different regions 112, 114, 116. In this discussion a region of semiconductor material which is not intentionally doped is described as an intrinsic region 114 as shown in FIG. 2A and FIGS. 3A-B. It will be understood by those skilled in the art, however, that an intrinsic region may in fact include a low concentration of p-type or n-type dopants. Dopants may diffuse into the intrinsic region from the adjacent n or p-doped regions (112 and 116, respectively in FIGS. 3A and 3B) or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral. The diode need not be limited to a p-i-n design as described; rather, a diode can comprise a combination of the different regions, each with different concentrations of dopants, as illustrated in FIGS. 4A-4D. Various additional cell structures and methods of making the memory cell will be described in more detail below.

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed. Such a diode preferably acts as a steering element of the memory cell because the diode does not change resistivity when certain voltage pulses are applied which are sufficient to switch the resistivity state of the carbon material.

In contrast, when an amorphous or microcrystalline silicon material is crystallized not in contact with a silicide with which it has a good lattice match, for example when silicon is crystallized in contact only with materials such as silicon dioxide and titanium nitride, with which it has a significant lattice mismatch, the resulting polysilicon will have many more defects, and doped polysilicon crystallized this way will be much less conductive as formed. Such diode can switch resistivity state when bias is applied. In this case, the diode can also serve as a resistivity switching element and as the steering element of the memory cell.

Figure 2B:
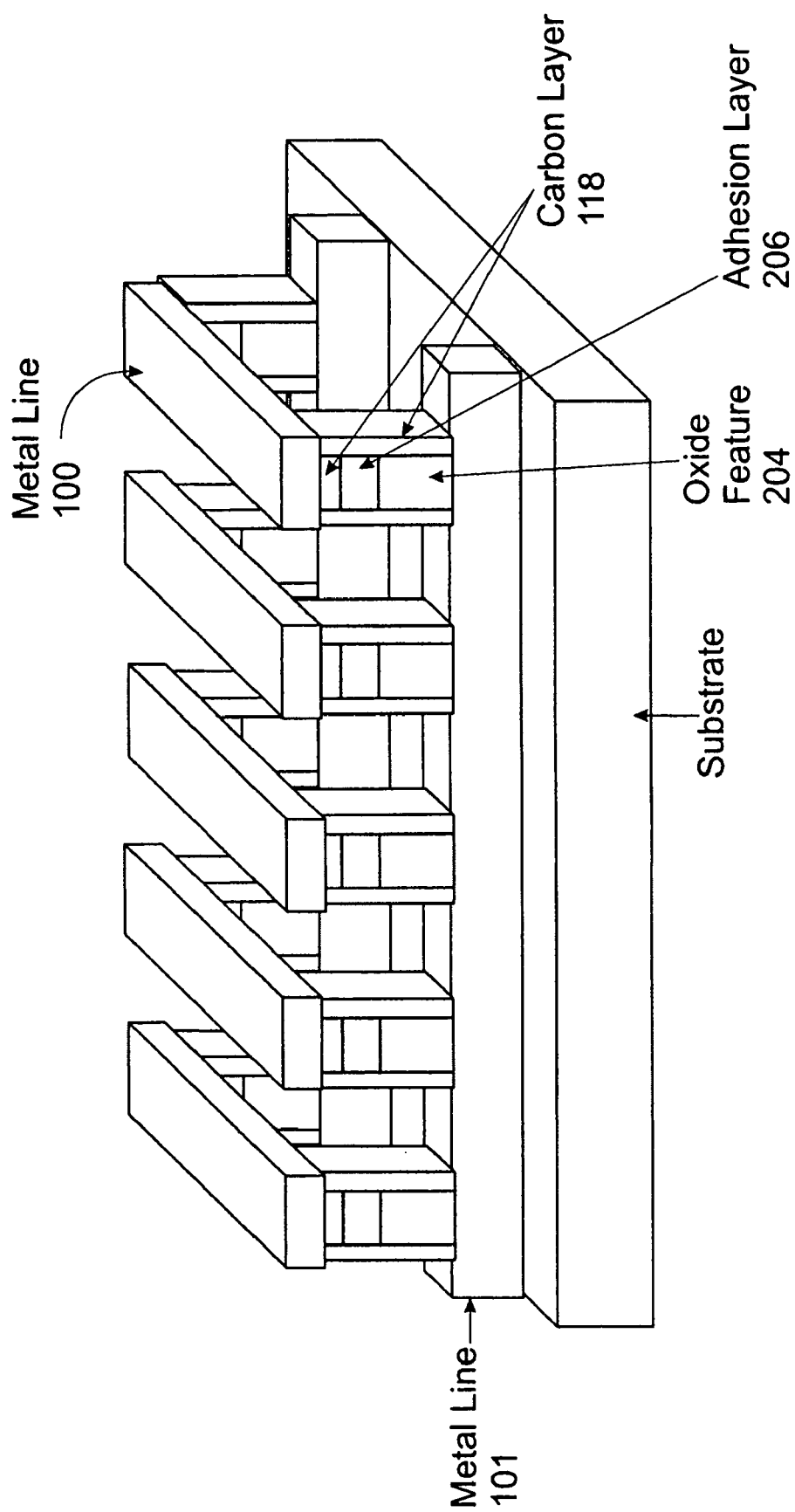
FIGS. 2B-2E are perspective views of memory cell arrays formed according to embodiments of the present invention.
Figure 2C:
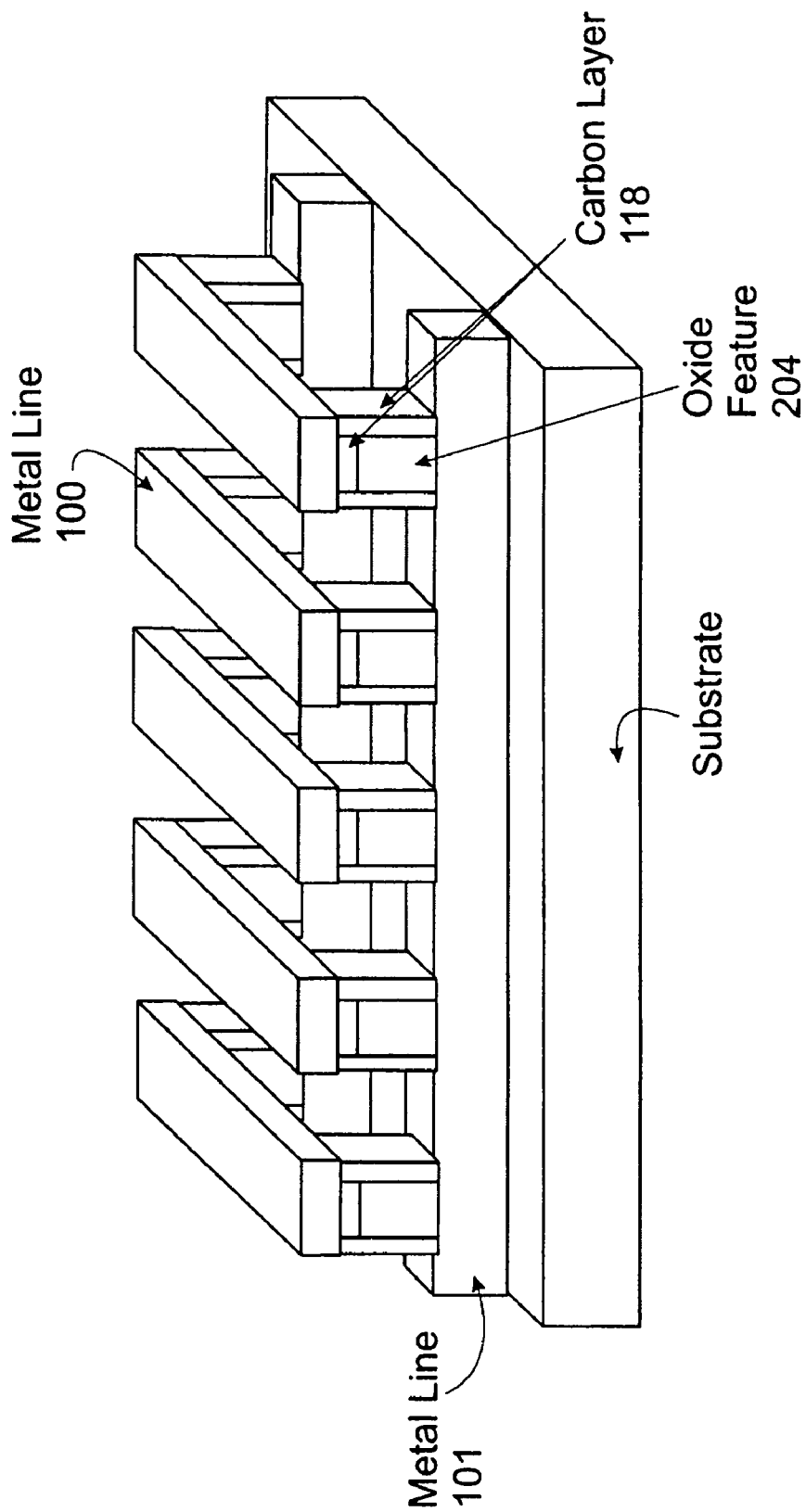
Figure 2D:
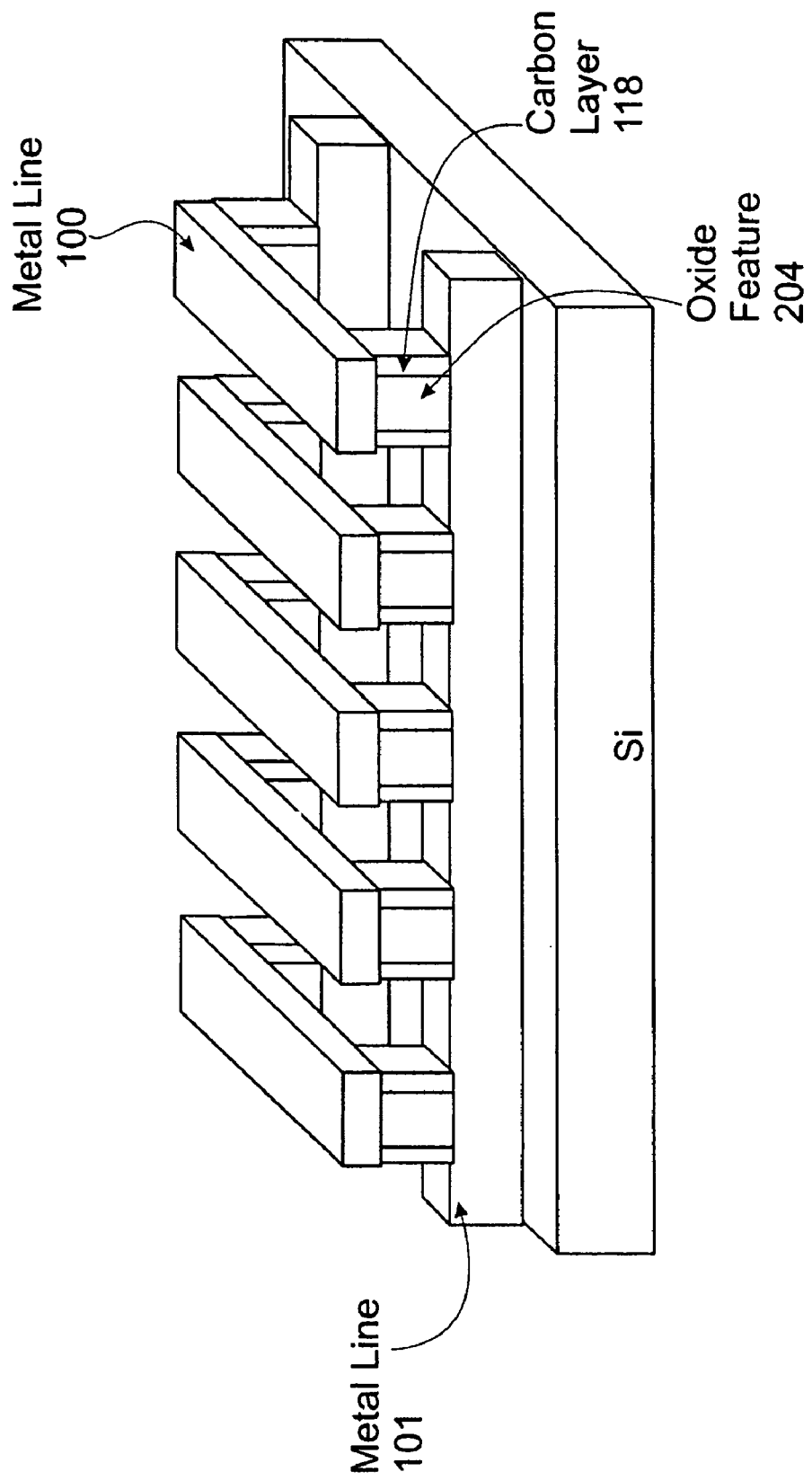

FIGS. 2B to 2E illustrate various embodiments of an array of memory cells. The diode steering element 110 is omitted from these figures for clarity. However, it should be understood that the diode steering element is located either above or below the storage element, such as the carbon resistivity switching material 118, as shown in FIG. 2A. As shown in FIG. 2B, a feature 204, such as an insulating material feature is formed above or below the diode. The feature may comprise any suitable pillar, post or rail or even a sidewall of a via or trench made of any suitable insulating material, such as silicon oxide, silicon nitride, organic insulating material, etc. The feature may have any suitable height, such as greater than 40 nm, such as 50-500 nm, for example 200-300 nm. The carbon resistivity switching material 118 is disposed on the sidewall(s) and over the top of this feature as a thin film or layer. This film or layer may have any suitable thickness, such as 2-10 nm, and a height which corresponds to the height of the feature 204 (i.e., preferably over 40 nm). Thus, the material 118 generally has a sidewall spacer shape on the sidewall of the feature. An optional adhesion layer 206, such as a silicon oxynitride or titanium nitride material is disposed on top and/or on the sides of the feature to promote adhesion between the feature and the carbon material. As shown in FIG. 2C, the adhesion layer may be omitted. Thus, the carbon resistivity switching material 118 in FIGS. 2B and 2C provides both a vertical conductive path (via the sidewall component) and a lateral (horizontal) conductive path between the upper and lower electrodes. As shown in FIG. 2D, the carbon resistivity switching material 118 is located only on the sidewall of the feature and thus provides only a vertical sidewall conductive path. A method of making this structure will be described in more detail below with respect to FIGS. 8A-8K.

Figure 2E:
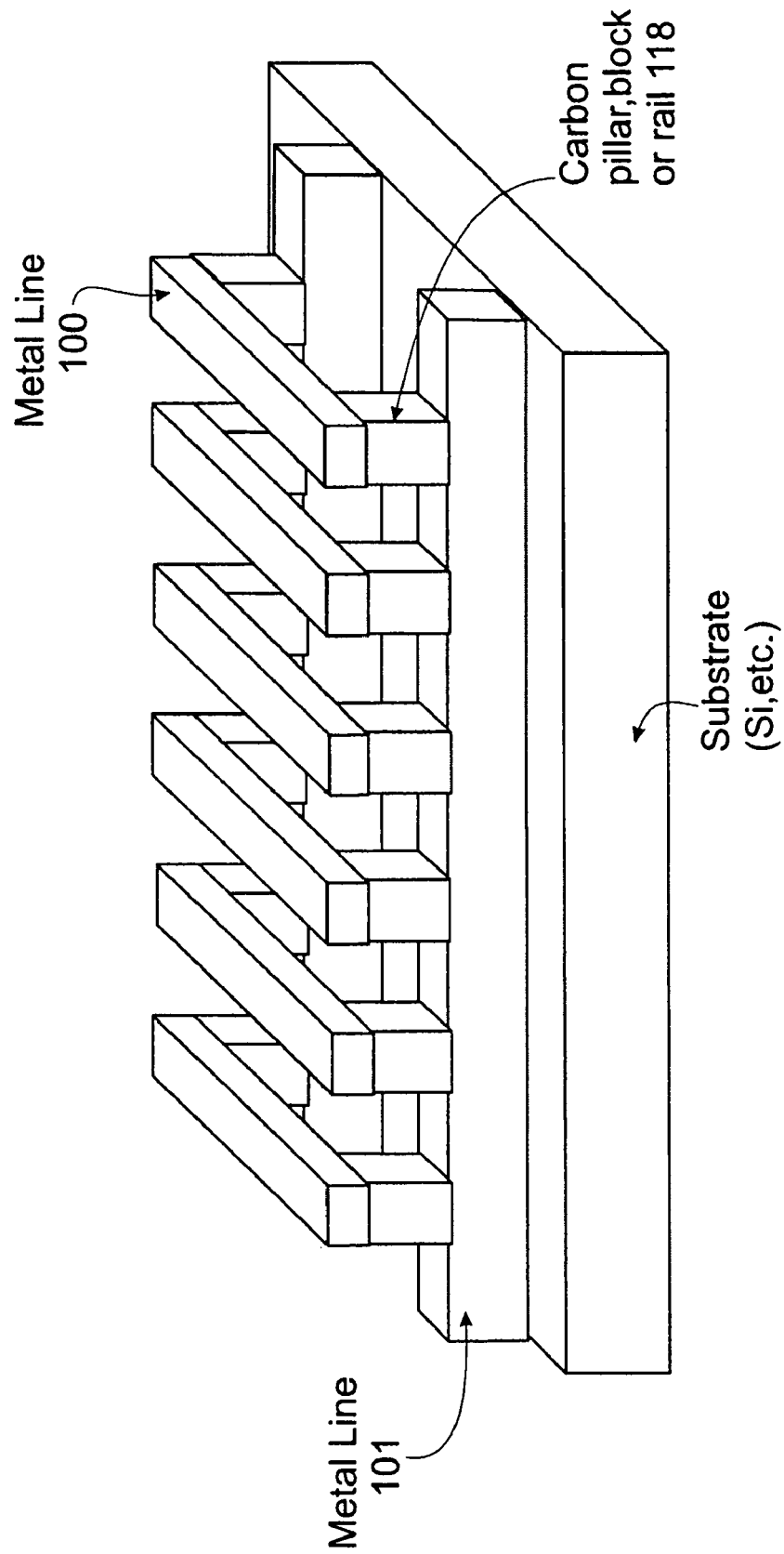
Figure 4A:
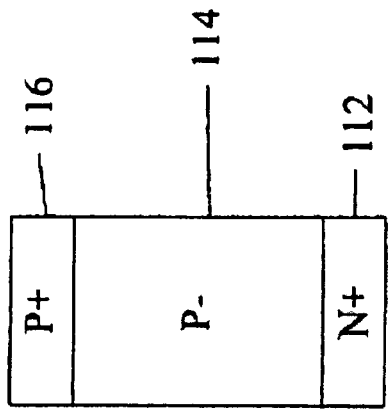
FIGS. 4A-4D are schematic side cross-sectional views illustrating alternative diode configurations according to an embodiment of the present invention.
Figure 4B:
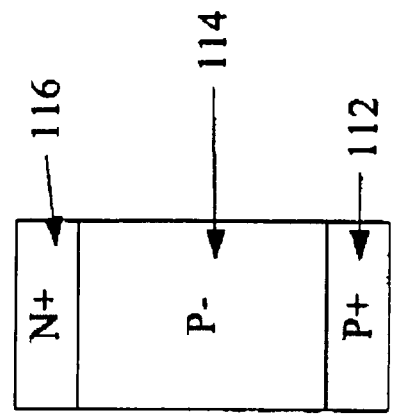
Figure 4C:
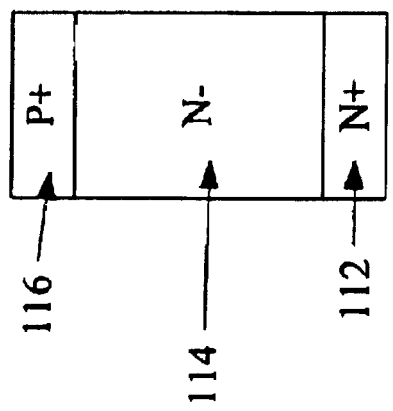
Figure 4D:
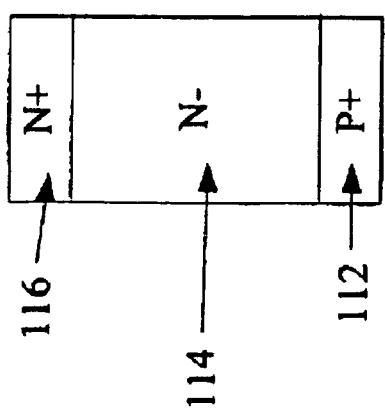

FIG. 2E shows an alternative structure, where the carbon resistivity switching material 118 is deposited into an opening, such as a trench or via in an insulating layer (not shown for clarity). The material 118 may be deposited by spray coating or spin coating a slurry or colloid containing the carbon material. In this structure, the carbon resistivity switching material 118 comprises a block or rail of material which provides a bulk vertical conductive path. In general, a height of the resistivity switching material 118 in a first direction from the first conductive electrode 101 to the second conductive electrode 100 may be greater than a thickness of the resistivity switching material in second direction perpendicular to the first direction. If the material 118 comprises a thin film or layer, then the thickness of at least a portion of the film or layer is oriented in a perpendicular direction to the current flow direction between the electrodes 100 and 101.

In one embodiment, the memory cell may be a one time programmable (OTP) cell. The term "one-time programmable" means that cell can be non-reversibly programmed into up to four different states. However, the cell is preferably a multi level cell (MLC) rewritable memory cell which has two or more distinct memory levels or states, such as two to four levels, which can be reversibly programmed. Thus, the cell is rewritable cell having multiple memory levels and during programming, the cell is placed into at least two different memory levels for at least two programming cycles.

The difference between the read currents of the unprogrammed and various programmed states constitutes the "window" for the memory cell. It is desirable for this window to be as large as possible for manufacturing robustness.

Distinct data states of the memory cell of the embodiments of the present invention correspond to resistivity states of the carbon based storage material in series with the diode. The memory cell can be put into distinct data states by a series of distinct forward biases, preferably ranging from 2 to 20 V, more preferably from 6 to 18 V. Preferably the current flowing through the cell between any one distinct data state and any different distinct data state is different by at least a factor of two, to allow the difference between the states to be readily detectable. The memory cell is read by applying a lower read voltage, such as 1-3 V, for example 2V, than the set or reset voltage.

Several examples of preferred embodiments will be provided. It will be understood, however, that these examples are not intended to be limiting. It will be apparent to those skilled in the art that other methods of programming a memory cell device comprising a steering element, such as a diode, and a carbon storage element will fall within the scope of the invention.

Due to the complexity of the carbon resistivity switching material, such as nanotubes, amorphous carbon, polycrystalline carbon or graphene, the time needed to program and erase carbon material is in the order of milliseconds (msec) using a conventional operation algorithm. The present inventors realized that controlling the fall times of the set and reset pulses allows a cell containing a carbon storage element material to be switched at higher speeds, such as less than 1 msec, for example 75 nanoseconds to 500 microseconds, to provide a higher bandwidth for the memory device.

In one embodiment of the invention, a method of programming the nonvolatile memory cell includes applying a reset pulse to change a resistivity state of the carbon material from a first state to a second state which is higher than the first state, and applying a set pulse to change a resistivity state of the carbon material from the second state to a third state which is lower than the second state, where a fall time of the reset pulse is shorter than a fall time of the set pulse. Preferably, the fall time of the reset pulse is at least ten times shorter than the fall time of the set pulse, such as 1000 to 10,000 times shorter.

FIGS. 5 and 6 are plots of pulse amplitude (e.g., voltage) versus time for the reset and set pulses, respectively. As shown in FIG. 5, the reset pulse 1 has a rise time segment 1A, a pulse duration segment 1B at the desired pulse amplitude, and a fall time segment 1C. As shown in FIG. 6, the reset pulse 10 has a rise time segment 10A, a pulse duration segment 10B at the desired pulse amplitude, and a fall time segment 10C. For example, the fall time (i.e., duration of segment 1C) of the reset pulse 1 is less than 10 nanoseconds long, such as 3 to 5 nanoseconds long, and the fall time (i.e., duration of segment 10C) of the set pulse 10 is between 1 and 200 microseconds long, such as 10 to 100 microseconds long.

In one embodiment, the duration of the reset pulse 1 is at least ten times shorter, such as 100 to 1,000 times shorter than a duration of the set pulse 10. For example, the reset pulse 1 duration (i.e., duration of segment 1B) is 20 to 300 nanoseconds, and the set pulse duration (i.e. duration of segment 10B) is 2 to 500 microseconds. In another embodiment, the set and/or reset pulse may have a triangular shape. In other words, the reset pulse may comprise only segments 1A and 1C and/or the set pulse may comprise only segments 10A and 10C. In this embodiment, the duration of segment 1B or 10B is zero.

The reset pulse and set pulse are preferably forward bias pulses (with respect to the diode steering element). In one embodiment, the reset pulse has a larger amplitude than the set pulse. The reset pulse may have an amplitude that is 50% to 150% larger than that of the set pulse. For example, the reset pulse may have a voltage amplitude of 16 to 20V, such as 18V, while the set pulse may have a voltage amplitude of 8 to 12V, such as 10 V.

Figure 7A:
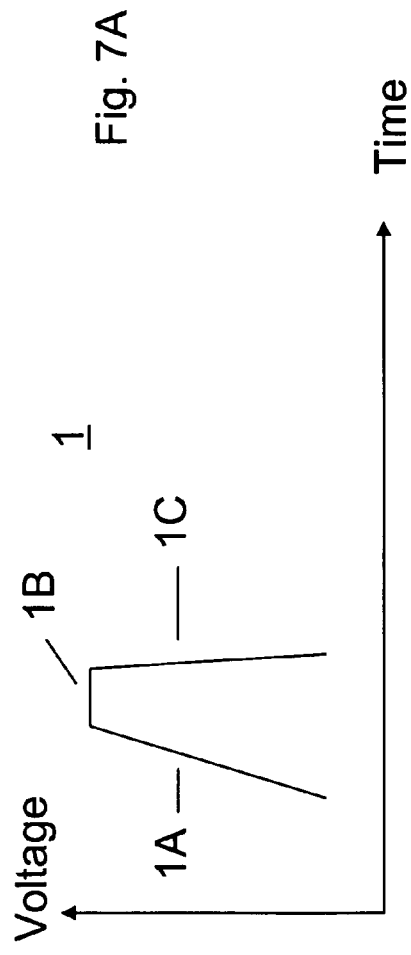
Figure 7B:
Figure 7C:
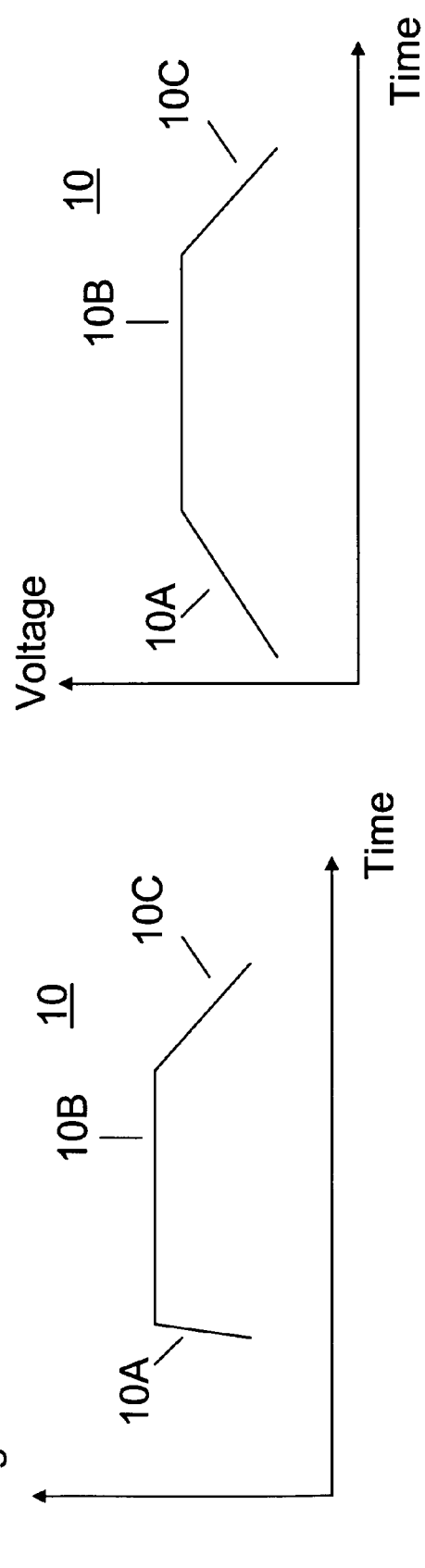

The rise times (i.e., segments 1A, 10A) of the set and reset pulses may have any desired shape and duration. For example, the rise time segments 1A and 10A may comprise mirror images of the fall time segments 1C, 10C, respectively. Alternatively, the reset pulse 1 may have a longer rise time than the fall time, as shown in FIG. 7A. Likewise, the set pulse 10 may have a shorter or longer rise time than the fall time, as shown in FIGS. 7B and 7C, respectively.

While single reset and set pulses are shown, it should be noted that multiple reset and/or set pulses may be applied. Thus, a second reset pulse may be applied to change a resistivity state of the carbon material and/or a second set pulse may be applied to change a resistivity state of the carbon material.

The carbon material of the storage element may comprise any suitable carbon resistivity switching material, such as amorphous carbon, polycrystalline carbon (which includes microcrystalline and nanocrystalline carbon), carbon nanotubes (including single walled and multi-walled carbon nanotubes), or graphene. In one embodiment, the carbon material comprises a carbon flake resistivity switching material, such as sheets or pieces of polycrystalline carbon comprising a hexagonal unit cell structure but lacking well defined and orderly A-B graphene sheet stacking of hexagonal graphite. Polycrystalline carbon may be formed by thermal CVD growth (1-2 minutes at 650 to 800 C using $H_2$ and $C_2H_2$ source gases. The polycrystalline carbon may have a first Raman spectrum peak between 1300 and 1350 $cm^{-1}$ and a second Raman spectrum peak between 1600 and 1650 $cm^{-1}$, as shown in FIG. 9.

Without wishing to be bound by any particular theory, the present inventors believe that the difference in fall time of the reset and set pulses may provide faster programming of the memory cell according to one or both of a thermal and vibrational theories. While polycrystalline carbon material is discussed below, it should be understood that other materials, such as amorphous carbon, nanotubes or graphene may also be used.

According to the non-limiting thermal theory, when a reset pulse 1 is applied to a carbon material in a relatively lower resistivity crystalline state, such as the polycrystalline, graphene or nanotube state, such material is at least partially converted to carbon material with a relatively higher resistivity state, such as an amorphous carbon material. For example, the crystalline material may be at least partially melted to the amorphous state during the reset pulse duration (i.e., during segment 1B in FIG. 5). During the short fall time of the reset pulse (i.e., during segment 1C in FIG. 5) the carbon material is quenched or very rapidly cooled so that it remains at least partially in the higher resistivity amorphous state.

In contrast, a set pulse 10 is applied to the carbon material to at least partially convert the carbon material from the higher resistivity state, such as the amorphous state, to a lower resistivity state, such as the polycrystalline state. For example, the crystalline material may be at least partially melted to the amorphous state during the set pulse duration (i.e., during segment 10B in FIG. 6). During the relatively long fall time of the set pulse (i.e., during segment 10C in FIG. 6), the carbon material is relatively slowly cooled and is allowed to at least partially crystallize to a lower resistivity state, such as the polycrystalline state. In other words, during the fall time of the set pulse, some heating is provided to the material by the applied current or voltage to allow slower cooling and crystallization. Thus, the longer fall time of the set pulse allows the melted material to crystallize to a relatively low resistivity polycrystalline state, while the shorter fall time of the reset pulse quenches or solidifies the melted material in the relatively high resistivity amorphous state.

According to the non-limiting vibrational theory, the current understanding of switching in a carbon flake resistivity switching material, such as sheets or pieces of polycrystalline carbon is related to the change in hybridization of the C—C bonds and/or the variation in distance between the flakes.

When the reset pulse 1 is applied to the carbon flake material, the carbon flakes separate from each other to increase a resistivity of the carbon flake material from a first state to a second state. When the set pulse 10 is applied to the carbon material, the carbon flakes contact each other more than in the second state to decrease a resistivity of the carbon flake material from the second state to a third state. Specifically, during the shorter reset pulse fall time, the carbon flakes are not in a potential energy minimum state as a function of interflake distance and are locked into the higher resistivity state. During the longer set pulse fall time, the carbon flakes are in a potential energy minimum state as a function of interflake distance and are locked into the lower resistivity state. The potential energy minimum state(s) may comprise one or more minima in a plot of Leonard-Jones potential versus distance between flakes.

In a non-limiting embodiment, the carbon flakes are bound or connected to each other after the set pulse. The set pulse connects the carbon or carbon flakes in the respective carbon material to make the carbon material more uniform (i.e., more compressed or fused together). This improves the electrical connection through each cell between the upper and lower electrodes.

In other words, during the relatively slow fall time of the set pulse, the flakes have time to settle into the minimum potential energy state and to allow the flakes to contact, bond, weld or collapse onto each other. In contrast, during the relatively fast fall time of the reset pulse, the flakes do not have sufficient time to settle from the non-minimum potential energy state (i.e., when the flakes are vibrating and are separated from each other) caused by the application of the reset current into the minimum potential energy state, and are locked into the separated (or relatively lower contact) and higher resistivity state when the reset pulse ends.

While carbon flake material is described above, other non-monolithic carbon materials, such as films of carbon nanotubes, may also be programmed in a similar manner. A current understanding of switching in carbon nanotubes is the mechanical switching through Van der Waals force or electrical switching through quantum wave of overlapping. The movement of the nanotubes closer or farther from each other in the nanotube film is facilitated by reset and set pulses with different fall times. In another embodiment, non-monolithic material, such as carbon nanotubes (single and multi-walled), carbon nanorods, nanohorns, etc., provided in a film or layer is programmed using at least one of set and reset pulses having a fall time of 15 ns or less, such as 5-10 ns. In one aspect of this embodiment, both set and reset pulses have a fall time of 15 ns or less. The set and reset pulse fall time may be similar or the same (i.e., set and reset pulses differ by 0-20%, such as 5-10% from each other). The set and reset pulse rise time and pulse duration may be similar or the same (i.e., set and reset pulses differ by 0-20%, such as 5-10% from each other), such as a rise time of 15 ns or less, such as 5-10 ns and a pulse duration of 40 ns or less, such as 20-30 ns. Preferably, the reset pulse duration is shorter than the set pulse duration. Likewise, the set and reset pulse amplitude may be similar or the same (i.e., differ by 0-20%, such as 5-10% from each other). In general, there may be an overlapping distribution of set and reset pulse rise time, fall time, duration and amplitude.

In another embodiment, one or more initialization pulses are used to in the method of programming the device, as described in U.S. application Ser. No. 12/153,873 filed on May 27, 2008, and which is incorporated herein by reference in its entirety. Preferably, the initialization pulse has a pulse width that is 1 millisecond or greater, such as 2-200 ms. Preferably the initialization pulse has a relatively long fall time, such as 10 to 100 microseconds. The initialization pulse voltage amplitude is preferably at least 10V, such as 10 to 14V, for example 10 to 12V (i.e., an initialization set pulse). Other pulse duration and voltages may also be used. Plural initialization pulses may also be used, such that an initialization reset pulse having a voltage amplitude of 10 to 20V may follow the set initialization pulse. However, the first reset pulse does not have to be an initialization pulse and may have a pulse width of less than 1 ms. The subsequent programming pulses, such as reset and/or set pulse preferably have a pulse width of less than 1 ms, such as 75 ns to 500 microseconds.

Generally, a device for programming the memory cells is a driver circuit located under, over, or adjacent to the memory cell. The circuit can have a monolithic integrated structure, or a plurality of integrated device packaged together or in close proximity or die-bonded together. For a detailed descriptions of the driver circuit, see for example, U.S. patent application Ser. No. 10/185,508 by Cleeves; U.S. patent application Ser. No. 09/560,626 by Knall; and U.S. Pat. No. 6,055,180 to Gudensen et al., each of which is hereby incorporated by reference.

The memory cell may be fabricated by any suitable methods. For example, the methods described U.S. patent application Ser. No. 11/125,939 filed on May 9, 2005 (which corresponds to U.S. Published Application No. 2006/0250836 to Herner et al.), and U.S. patent application Ser. No. 11/395,995 filed on Mar. 31, 2006 (which corresponds to U.S. Patent Published Application No. 2006/0250837 to Herner et al.,) which are incorporated by reference in their entirety may be used.

Figure 8A:
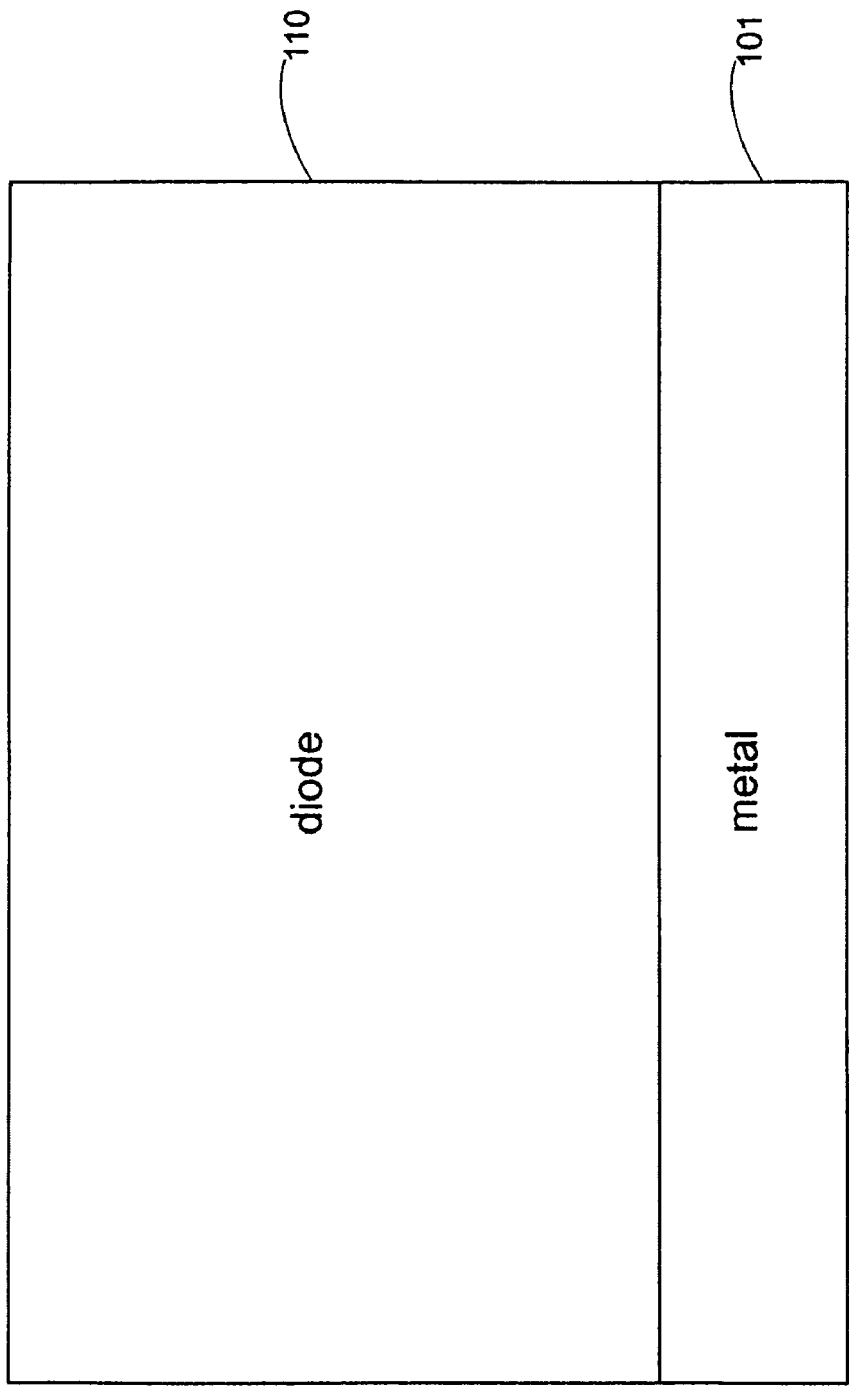
FIGS. 8A-8K are side cross sectional views of steps in a method of making of memory cells according to an embodiment of the invention.
Figure 8B:
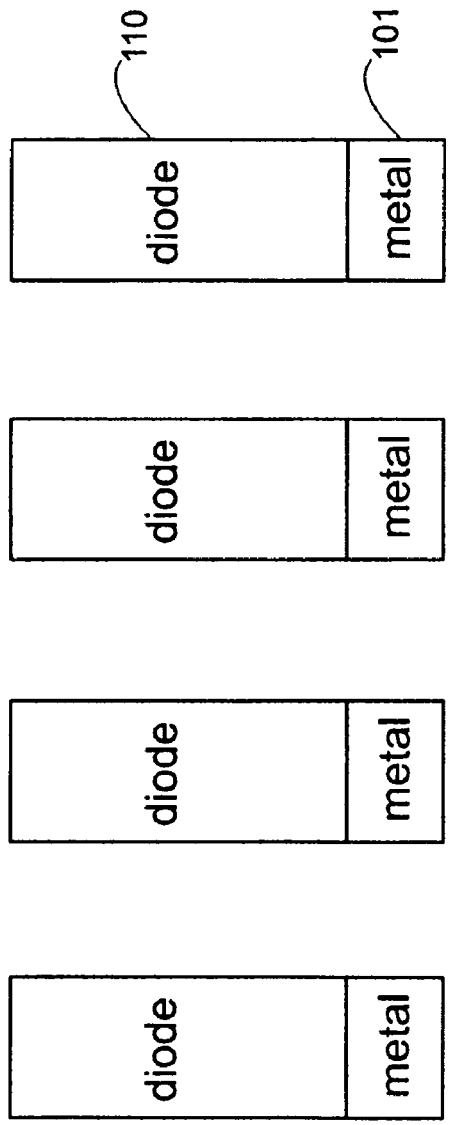
Figure 8C:
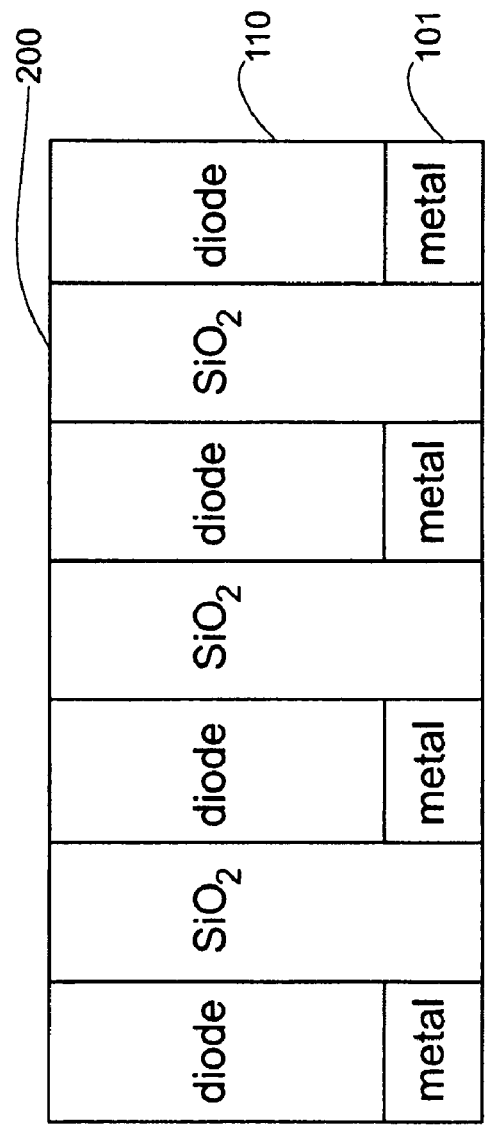

FIGS. 8A to 8K illustrate one exemplary method of making an array of memory cells shown in FIG. 2D. As shown in FIG. 8A, the diode 110 semiconductor layers 112, 114, 116 are formed over a lower electrode 101 using any suitable deposition and patterning methods, including in-situ doping during deposition and/or ion implantation into an intrinsic region. The diode 110 and lower electrodes 101 are then patterned either sequentially or in the same step, as shown in FIG. 8B. Preferably, the diodes are formed in shape of a cylindrical pillar and the lower electrodes comprise rails (which extend in and out of the page and connect plural diodes). A gap fill insulating layer 200, such as silicon oxide, silicon nitride, organic insulating material, etc. is formed between the lower electrodes and the diodes and is then planarized. This step is shown in FIG. 8C. The insulating layer may be formed in two separate steps as follows. The lower portion is formed between the electrodes first, followed by planarization step (such as a chemical mechanical polishing (CMP) or etchback step), followed by diode formation, followed by forming the upper portion of the insulating layer between the diodes, and followed by another planarization step.

Figure 8D:
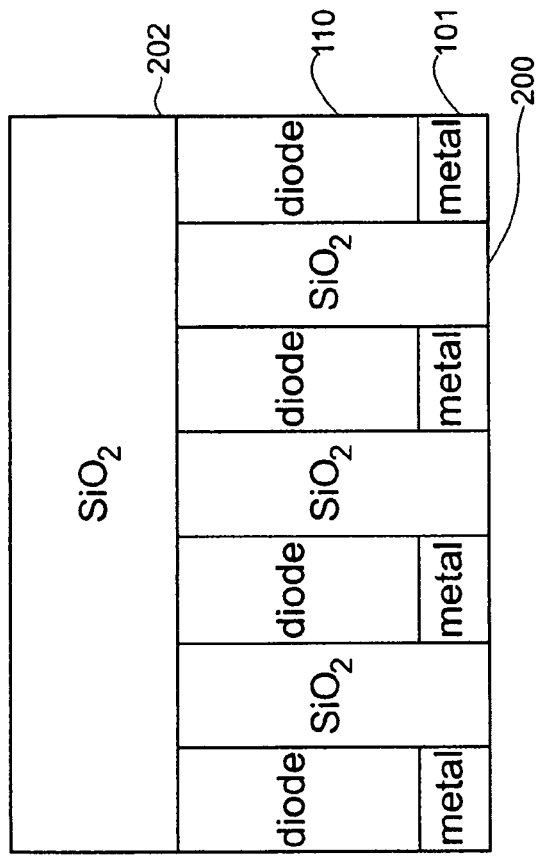
Figure 8E:
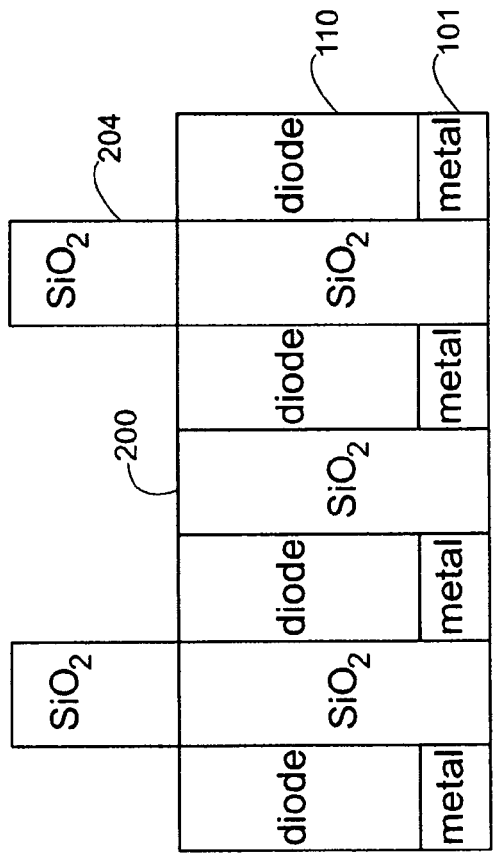

Then, as shown in FIG. 8D, another insulating layer 202, such as silicon oxide, silicon nitride, organic insulating material, etc., is formed over the diodes. This insulating layer is then patterned into features 204 having any suitable shape, such as pillars, rails, blocks, etc, as shown in FIG. 8E. The upper surface of the diode 110 is partially or fully exposed between the features. For example, each feature may be located in every other space between the diodes (i.e., over each second of the insulating layer 200 located between the diodes 110).

Figure 8F:
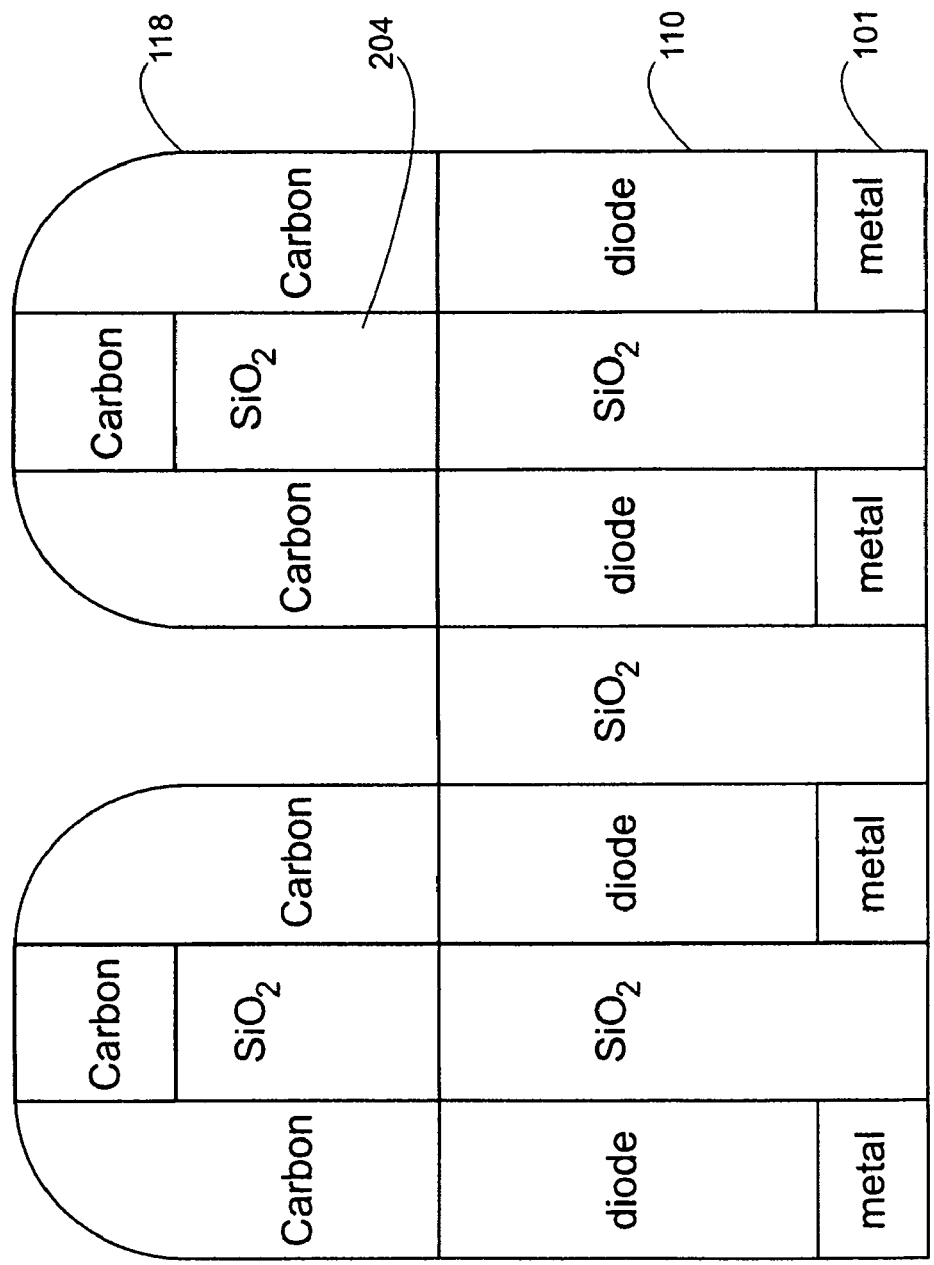

As shown in FIG. 8F, the carbon resistivity switching material 118 film or layer is deposited over the features and on the sidewalls of the features. The film 118 may be formed by thermal CVD growth (1-2 minutes at 650 to 800 C using $H_2$ and $C_2H_2$ source gases for polycrystalline carbon) or by spray coating or spin coating a colloid or slurry of nanotubes, graphene or polycrystalline carbon in a solvent.

Figure 8G:
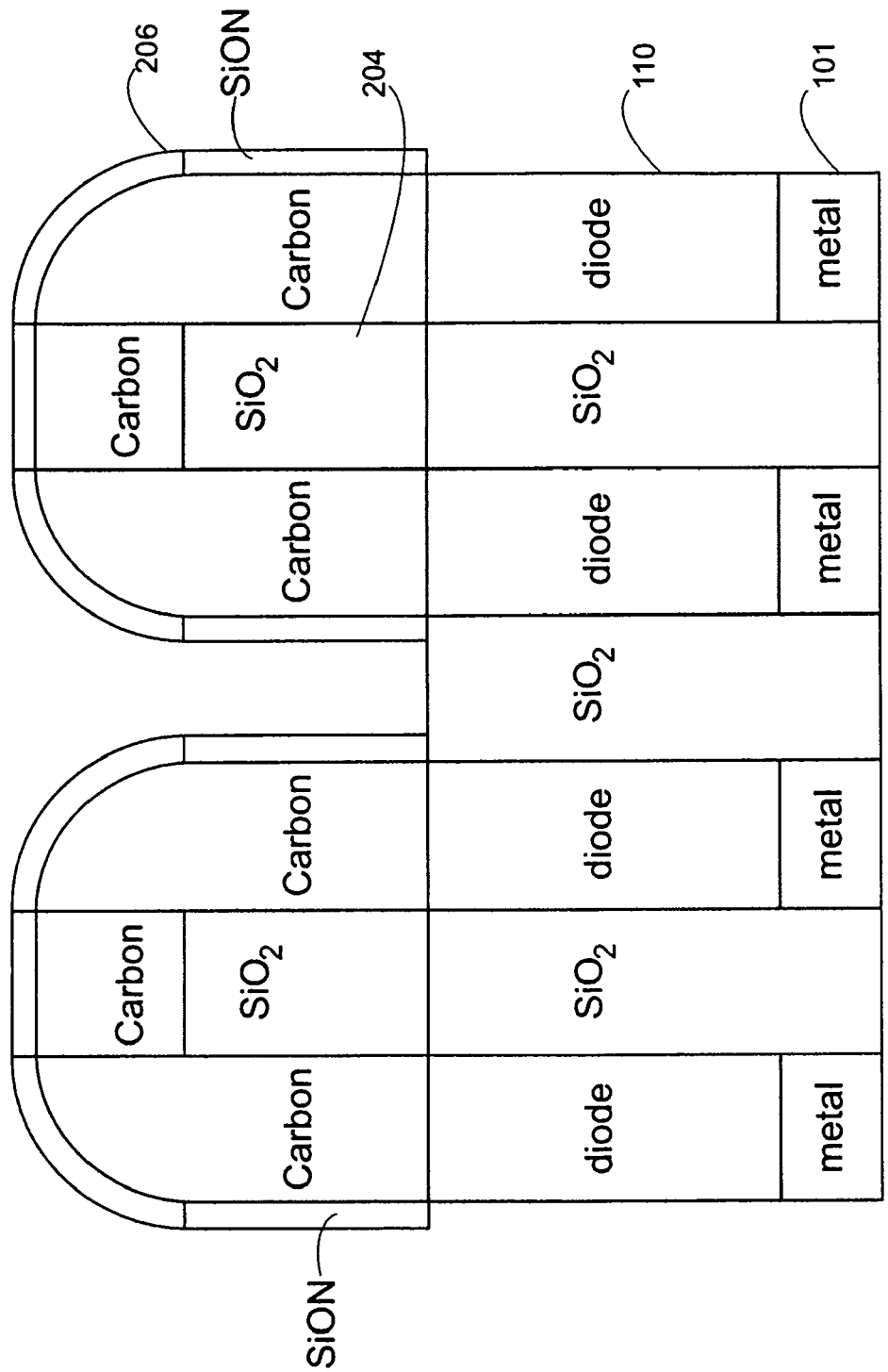

The film or layer 118 may be subjected to a spacer type etch to remove its portions from the upper surface of regions 200. This etch makes the film 118 discontinuous, such that the portion of thin film 118 storage element in one cell does not contact a portion of the thin film 118 storage element of an adjacent cell. If desired, an optional adhesion layer 206, such as silicon oxynitride or another suitable material is deposited over the film 118, as shown in FIG. 8G. Alternatively, the adhesion layer may also be located over each feature, such that it would be located under the carbon film 118. TiN or other materials may also be used instead of SiON for layer 206.

Figure 8H:
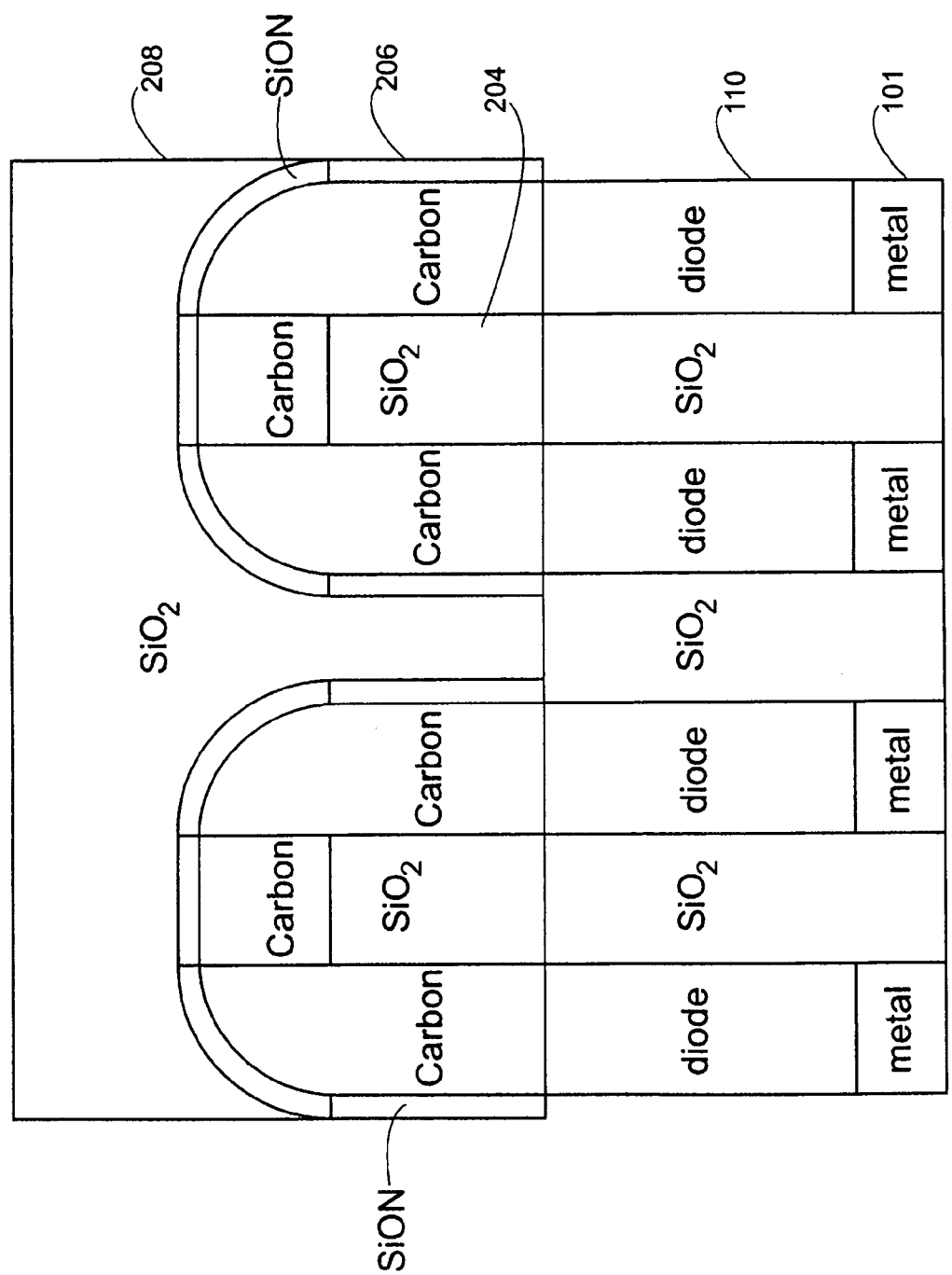
Figure 8I:
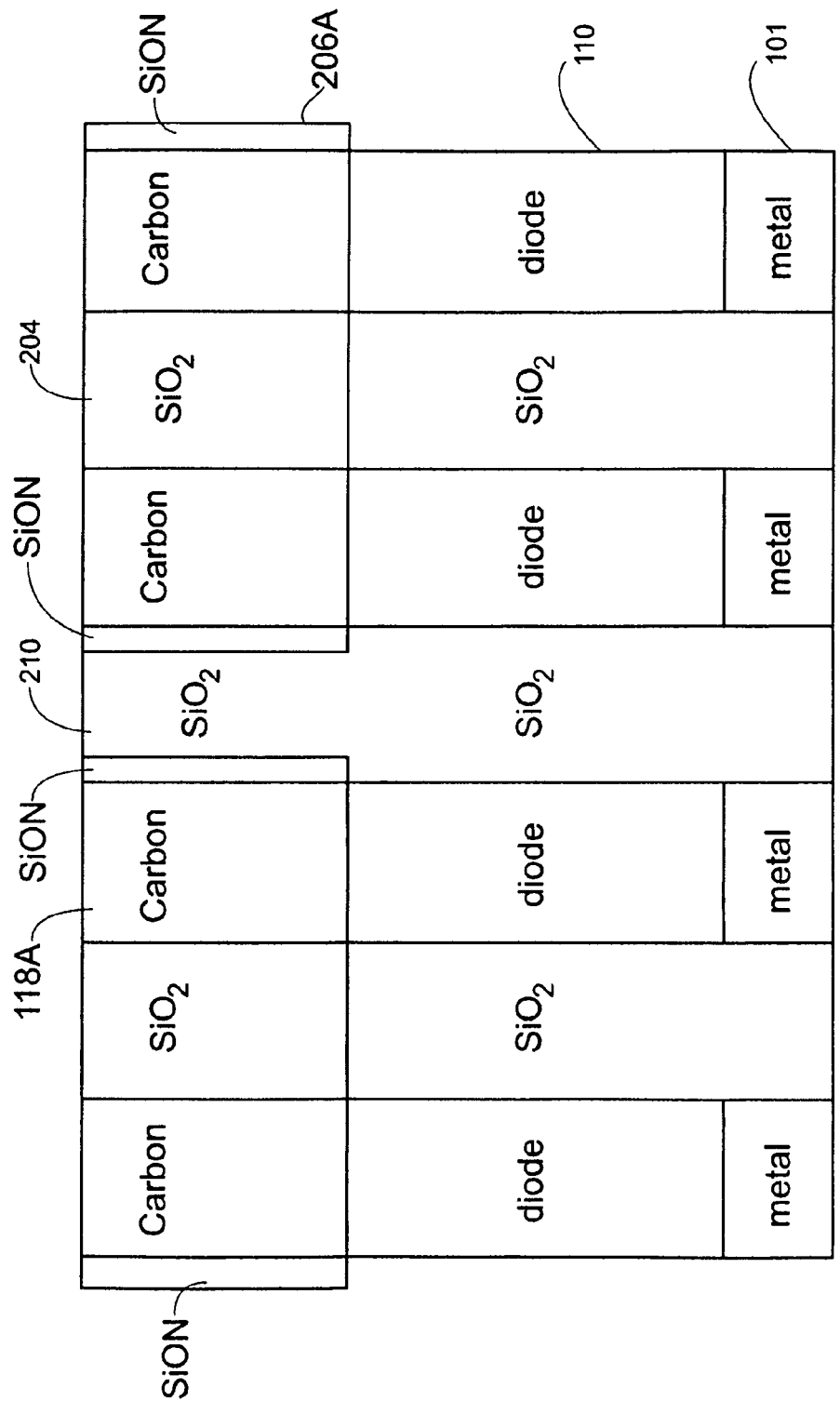

Then, another gap fill insulating layer 208 (such as silicon oxide, silicon nitride, organic insulating material, etc.) is deposited over the carbon film 118 and the adhesion layer, as shown in FIG. 8H. This gap fill insulating layer is then planarized by CMP or etchback with the upper surface of the features 204 to form gap fill insulating regions 210, as shown in FIG. 8I. During this planarization step, the carbon film 118 and the adhesion layer are removed from the upper surface of each feature. Thus, the carbon film 118 remains only on the sidewalls of the features and the upper surface or edges of the carbon film sidewalls 118A are exposed between the features and the gap fill insulating regions. The bottom end of each carbon film sidewall 118A contacts the upper surface (i.e., the p+ region 116 for example) of the diode 110. The adhesion layer 206A is located between the carbon sidewalls and the planarized gap fill dielectric regions.

Figure 8J:
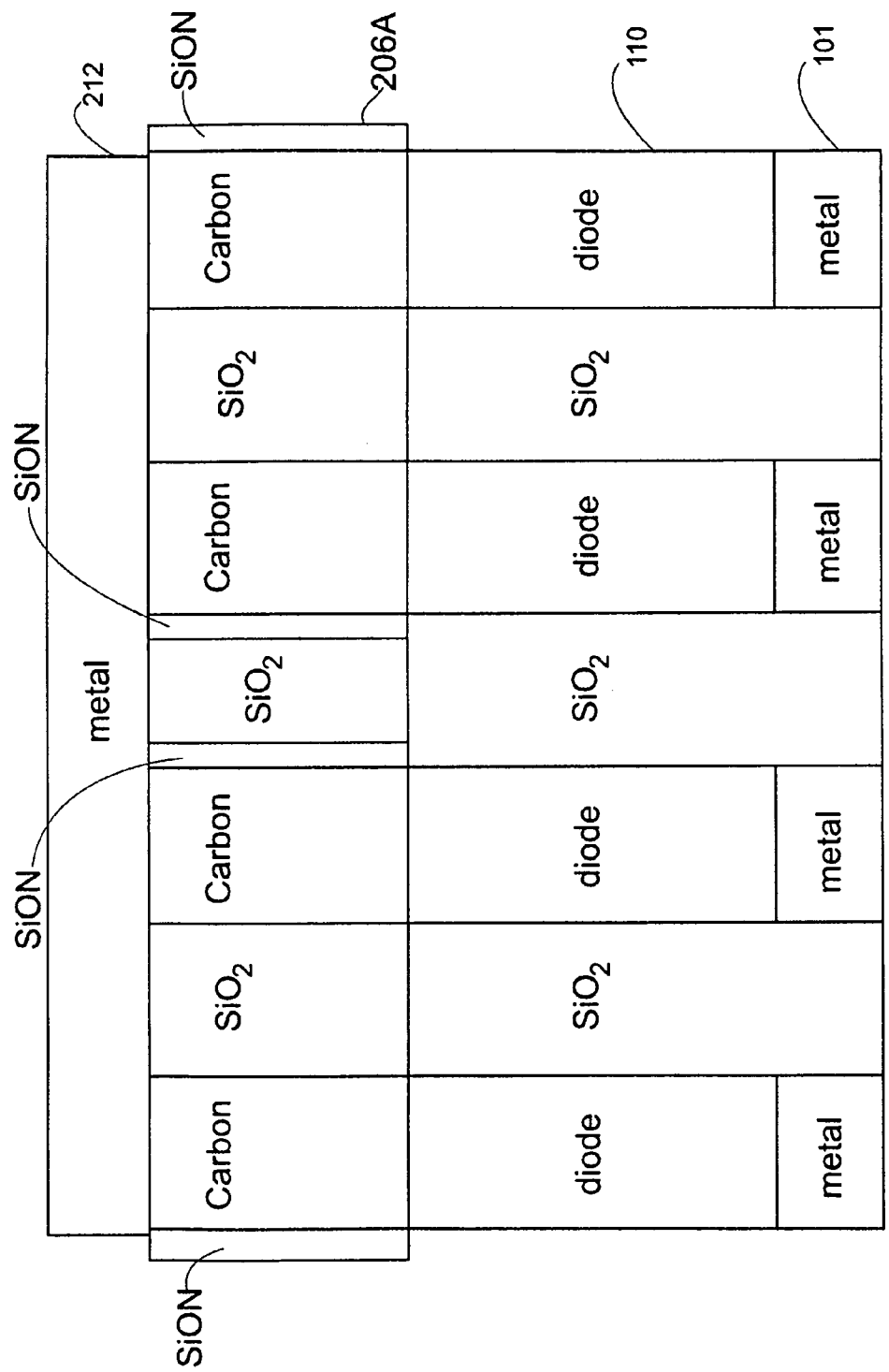
Figure 8K:
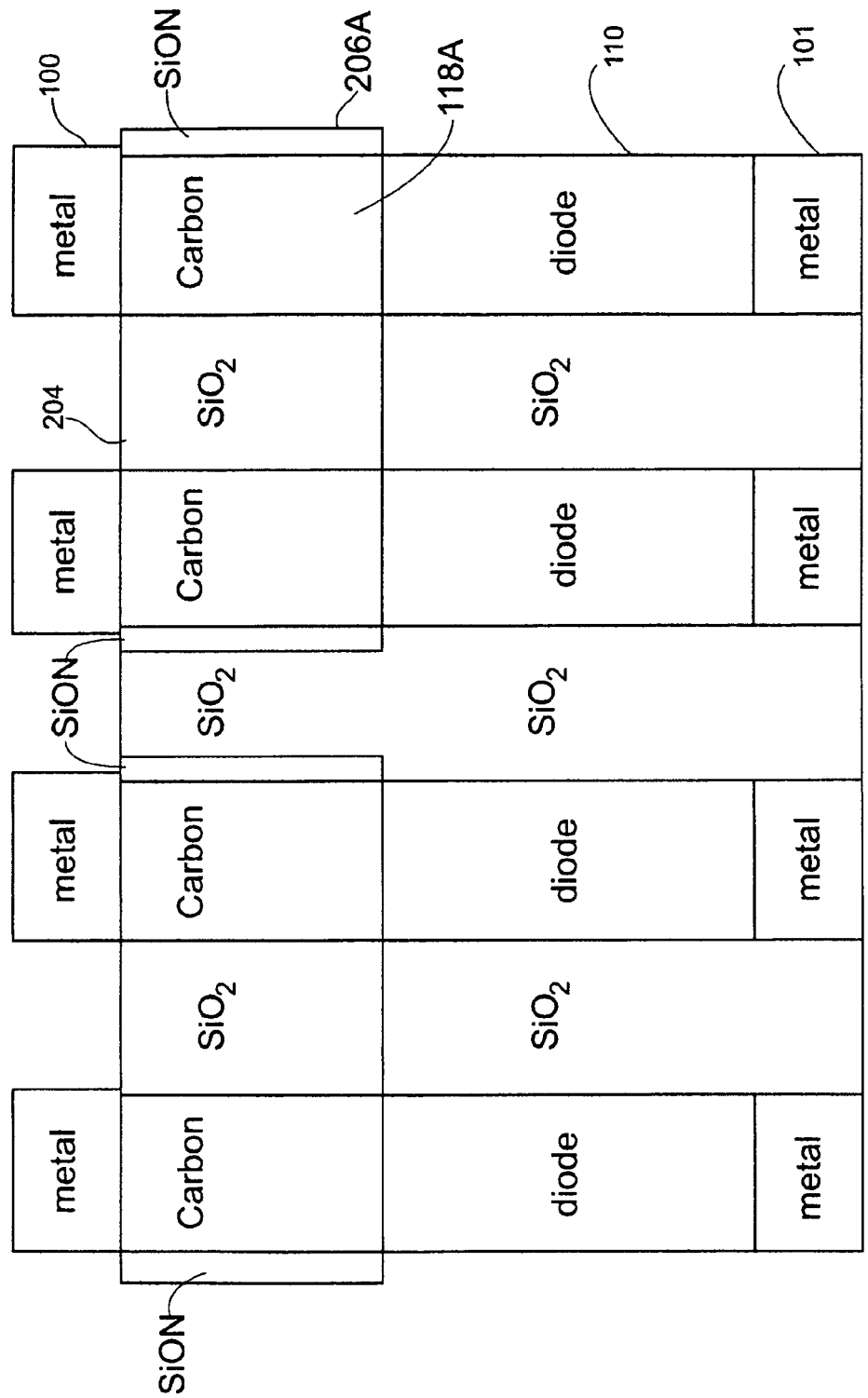

As shown in FIG. 8J, the upper conductive layer 212 is then deposited over the structure. This conductive layer is then patterned into rail shaped upper electrodes 100 which electrically contact the exposed upper portions of the carbon sidewalls 118A, as shown in FIG. 8K. As noted above, the film 118A may be located below the diodes 110 in an alternative configuration. Furthermore, additional layers may be inserted between the above described elements. However, if these intervening layers are conductive, then the above described are still electrically connected to each other.

In alternative embodiments, rather than depositing a carbon material, such as polycrystalline carbon or graphene by high temperature CVD, the carbon material may be formed by a low temperature method, as described for example in U.S. application Ser. No. 12/222,341 filed on Aug. 7, 2008 and incorporated herein by reference in its entirety. For example, one alternative embodiment of the invention provides a method of making a nonvolatile memory cell, comprising forming a steering element and forming a graphene storage element, wherein the step of forming the graphene storage element comprises providing graphene oxide, converting the graphene oxide into a graphene oxide colloid, reducing the graphene oxide colloid to a graphene colloid, and coating the graphene colloid over a substrate to form a graphene layer. Alternatively, the graphene oxide can be converted to graphene after the colloid is deposited over the substrate. The colloid can be obtained from a graphite or graphene oxide source material. For example, the graphite oxide can be firstly obtained from graphite by a modified Hummers method as originally presented by Kovtyukhova and colleagues (Hummers et al., *J. Am. Chem. Soc.* 80, 1339 (1958), and Kovtyukhova et al., *Chem. Mater.* 11, 771-778 (1999), and as described in Li et al., *Nature Nanotechnology*, 3, 101-105 (2008)), which are all hereby incorporated by reference. As-synthesized graphite oxide can be suspended in water to give a brown dispersion, which is subjected to dialysis to completely remove residual salts and acids. Ultrapure Milli-Q® water can be used. As-purified graphite oxide suspensions can be then dispersed in water to create an around 0.05 wt % dispersion. Exfoliation of graphite oxide to graphene oxide colloids can be achieved by ultrasonication of the dispersion using a Brandson Digital Sonifier (S450D, 500 W, 30% amplitude) for 30 min. In order to obtain graphene oxide colloid, the above obtained brown dispersion can be then subjected to 30 min of centrifugation at 3,000 r.p.m. to remove any unexfoliated graphite oxide (usually present in a very small amount) using an Eppendorf 5702 centrifuge with a rotor radius of 14 cm. The resulting homogeneous dispersion (5.0 ml) can be mixed with 5.0 ml of water, 5.0 µl of hydrazine solution (35 wt % in water, Aldrich) and 35.0 µl of ammonia solution (28 wt % in water, Crown Scientific) in a 20-ml glass vial to further obtain a graphene colloid. The weight ratio of hydrazine to graphene oxide can be about 7:10. After being vigorously shaken or stirred for a few minutes, the vial can be put in a water bath (~95° C.) for 1 h. The obtained graphene colloid can be sprayed or spin coated onto a surface to form a graphene layer. The graphene colloid can be coated over the steering element or under the steering element of the memory cell. Some or all graphene may be substituted with polycrystalline (including micro and nanocrystalline) and/or amorphous carbon flakes, depending on the processing conditions. The concentration of hydrazine in the reduction mixture can be varied from 0.0175 wt % (used in the above procedure) to 1.75 wt %. In order to obtain stable dispersions when the concentration is greater than 0.0175 wt %, excess hydrazine in the resulting dispersions can be removed by dialysis against an around 0.5% ammonia solution once the reduction is complete. Reducing reagents and bases other than hydrazine and/or ammonia can be also be used.

In another alternative embodiment, the graphene oxide colloid can be spun-on or sprayed onto a surface to form a graphene oxide layer. The formed graphene oxide layer can then be reduced to a graphene layer by hydrazine or other reducing reagents. The graphene oxide colloid can be coated over the steering element or under the steering element. As noted above, some or all graphene may be substituted with polycrystalline and/or amorphous carbon flakes, depending on the processing conditions, such as on the reducing treatment.

In another alternative embodiment, a graphene colloid can contain graphene pieces, obtained by chemically separating graphite flakes into graphene sheets followed by breaking the graphene sheets into graphene pieces to further form a colloid of graphene. As noted above, some or all graphene may be substituted with polycrystalline and/or amorphous carbon flakes, depending on the processing conditions, such as the chemical and physical processing conditions. The obtained graphene colloid can be sprayed or spin coated onto a surface to form a graphene layer. The graphene colloid can be coated over the steering element or can be coated under the steering element. Exemplary methods of making a graphene colloid from graphite flakes can be found in U.S. Pat. No. 3,404,061 and U.S. Pat. No. 7,105,108; see also *Science* 22 Oct. 2004, Vol. 306. no. 5696, pp. 666-669 (mechanical exfoliation of graphite to form graphene), which are all hereby incorporated by reference.

In another alternative method, rather than depositing and patterning the semiconductor layers to form the diode, as described above, the semiconductor material is formed in openings in an insulating layer. This can be performed by either selectively depositing the semiconductor material into openings in the insulating layer or the semiconductor material is non-selectively deposited into openings in the insulating layer and over the upper surface of the insulating layer and then planarized, as described in U.S. application Ser. No. 12/007,780 and U.S. application Ser. No. 12/007,781, both filed on Jan. 15, 2008, which are hereby incorporated by reference in their entirety. The carbon film 118 may also be deposited into the openings in the insulating layer, such that the film 118 forms a sidewall spacer on a portion of the sidewall of the opening, followed by the planarization step. In this case, the features may be omitted. Likewise, the upper electrodes 100 may also be formed in the openings by a damascene process.

The above described memory arrays shown in FIGS. 2A-2E may be located in a one memory level device. If desired, additional memory levels can be formed above the first memory level to form a monolithic three dimensional memory array. In some embodiments, conductors can be shared between memory levels; i.e. top conductor 100 shown in FIG. 2A would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of programming a nonvolatile memory cell comprising a steering element located in series with a storage element, wherein the storage element comprises a carbon material, the method comprising:
    applying a reset pulse to change a resistivity state of the carbon material from a first state to a second state which is higher than the first state; and
    applying a set pulse to change a resistivity state of the carbon material from the second state to a third state which is lower than the second state,
    wherein a fall time of the reset pulse is shorter than a fall time of the set pulse, and
    wherein the steering element comprises a diode or a transistor and the carbon material comprises a carbon flake resistivity switching material.

2. The method of claim 1, wherein the fall time of the reset pulse is at least ten times shorter than the fall time of the set pulse.

3. The method of claim 2, further comprising:
    applying a second reset pulse to change a resistivity state of the carbon material; and
    applying a second set pulse to change a resistivity state of the carbon material.

4. The method of claim 1, wherein the fall time of the reset pulse is less than 10 nanoseconds long and the fall time of the set pulse is between 1 and 200 microseconds long.

5. The method of claim 1, wherein the fall time of the reset pulse is 3 to 5 nanoseconds long and the fall time of the set pulse is between 10 and 100 microseconds long.

6. The method of claim 1, wherein:
    the reset pulse and set pulse comprise forward bias pulses; and
    the reset pulse has a larger amplitude than the set pulse.

7. The method of claim 6, wherein a duration of the reset pulse is at least ten times shorter than a duration of the set pulse.

8. The method of claim 7, wherein reset pulse has a duration of 20 to 300 nanoseconds and the set pulse has a duration of 2 to 500 microseconds.

9. The method of claim 1, wherein memory cell comprises a portion of a monolithic three dimensional array of nonvolatile memory cells.

10. The method of claim 1, wherein the steering element comprises the diode and the carbon material comprises sheets or pieces of polycrystalline carbon comprising a hexagonal unit cell structure but lacking well defined and orderly A-B graphene sheet stacking of hexagonal graphite.

11. The method of claim 10, wherein the carbon material comprises the polycrystalline carbon having a first Raman spectrum peak between 1300 and 1350 $cm^{-1}$ and a second Raman spectrum peak between 1600 and 1650 $cm^{-1}$.

12. A method of programming a nonvolatile memory cell comprising a steering element located in series with a storage element, wherein the storage element comprises a carbon material, the method comprising:
    applying a reset pulse to the carbon material in a lower resistivity polycrystalline state to at least partially convert the carbon material to a higher resistivity amorphous state and to quench the carbon material into the higher resistivity amorphous state; and
    applying a set pulse to the carbon material to at least partially convert the carbon material from the higher resistivity amorphous state to the lower resistivity polycrystalline state,
    wherein a fall time of the reset pulse is shorter than a fall time of the set pulse, and
    wherein:
    the fall time of the reset pulse is 3 to 5 nanoseconds long;

the fall time of the set pulse is between 10 and 100 microseconds long;
the reset pulse and set pulse comprise forward bias pulses;
the reset pulse has a larger amplitude than the set pulse;
a duration of the reset pulse is at least ten times shorter than a duration of the set pulse;
the steering element comprises a diode; and
the polycrystalline carbon material comprises a carbon flake resistivity switching material.

13. The method of claim 12, wherein:
the carbon material is at least partially melted during the reset pulse and the carbon material is cooled to the amorphous state during a fall time of the reset pulse; and
the carbon material is at least partially melted during the set pulse and is cooled to the polycrystalline state at a slower rate than during the reset pulse.

14. A method of programming a nonvolatile memory cell comprising a steering element located in series with a storage element, wherein the storage element comprises a carbon flake material, the method comprising:
applying a reset pulse to the carbon flake material such that carbon flakes separate from each other to increase a resistivity of the carbon flake material from a first state to a second state; and
applying a set pulse to the carbon material such that the carbon flakes contact each other more than in the second state to decrease a resistivity of the carbon flake material from the second state to a third state.

15. The method of claim 14, wherein:
a fall time of the reset pulse is shorter than a fall time of the set pulse;
during the shorter reset pulse fall time, the carbon flakes are not in a potential energy minimum state as a function of interflake distance and are locked into the second resistivity state;
during the longer set pulse fall time, the carbon flakes are in a potential energy minimum state as a function of interflake distance and are locked into the third resistivity state.

16. The method of claim 15, wherein the carbon flakes are bound to each other after the set pulse.

17. The method of claim 14, wherein:
the fall time of the reset pulse is 3 to 5 nanoseconds long;
the fall time of the set pulse is between 10 and 100 microseconds long;
the reset pulse and set pulse comprise forward bias pulses;
the reset pulse has a larger amplitude than the set pulse;
a duration of the reset pulse is at least ten times shorter than a duration of the set pulse;
the steering element comprises a diode; and
the polycrystalline carbon material comprises a polycrystalline carbon flake resistivity switching material.

18. A method of programming a nonvolatile memory cell comprising a steering element located in series with a storage element, wherein the storage element comprises a non-monolithic carbon material, the method comprising:
applying a reset pulse to change a resistivity state of the carbon material from a first state to a second state which is higher than the first state; and
applying a set pulse to change a resistivity state of the carbon material from the second state to a third state which is lower than the second state, wherein a fall time of both of the reset pulse and the set pulse is 15 ns or less, a rise time of both of the reset pulse and the set pulse is 15 ns or less and a pulse duration of both of the reset pulse and the set pulse is 40 ns or less,
wherein the non-monolithic carbon material comprises carbon nanotubes and the steering element comprises a diode.

* * * * *